(12) United States Patent
Lim

(10) Patent No.: US 10,425,219 B2
(45) Date of Patent: Sep. 24, 2019

(54) ELECTRONIC CIRCUIT CONFIGURED TO ADJUST SKEW BETWEEN CLOCK SIGNALS

(71) Applicant: SAMSUNG ELECTRONICS CO., LTD., Suwon-si, Gyeonggi-do (KR)

(72) Inventor: Donghyuk Lim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/960,686

(22) Filed: Apr. 24, 2018

(65) Prior Publication Data

US 2019/0058576 A1 Feb. 21, 2019

(30) Foreign Application Priority Data

Aug. 18, 2017 (KR) .................. 10-2017-0104750

(51) Int. Cl.
*H04L 25/49* (2006.01)
*H04L 7/033* (2006.01)
*H04L 7/00* (2006.01)

(52) U.S. Cl.
CPC .......... *H04L 7/0334* (2013.01); *H04L 7/0037* (2013.01); *H04L 7/0331* (2013.01)

(58) Field of Classification Search
CPC . H04L 25/062; H04L 25/4917; H04L 7/0337; H04L 25/03949; H03M 1/12; H03M 1/00; G06F 1/10
USPC .................. 375/287, 232, 355; 327/155, 156
See application file for complete search history.

(56) References Cited

U.S. PATENT DOCUMENTS

| | | | |
|---|---|---|---|
| 8,243,866 B2 | 8/2012 | Huang et al. | |
| 8,649,476 B2 | 2/2014 | Malipatil et al. | |
| 8,830,094 B1 | 9/2014 | Erdmann | |
| 8,860,467 B2 | 10/2014 | Malipatil et al. | |
| 8,983,014 B2 | 3/2015 | Shibasaki | |
| 8,989,333 B2 | 3/2015 | Hashida et al. | |
| 9,118,451 B2 | 8/2015 | Kibune et al. | |
| 9,166,771 B2 | 10/2015 | Shibasaki | |
| 9,209,825 B1 | 12/2015 | Visani et al. | |
| 9,325,489 B2 | 4/2016 | Hsieh et al. | |
| 9,553,600 B1 | 1/2017 | Lacroix et al. | |
| 9,596,108 B2 | 3/2017 | Iyer et al. | |
| 2008/0080649 A1* | 4/2008 | Gibbons | H03L 7/0812 375/355 |
| 2012/0257652 A1* | 10/2012 | Malipatil | H04L 7/0062 375/219 |
| 2016/0147703 A1* | 5/2016 | Park | G06F 13/14 710/106 |
| 2017/0118046 A1* | 4/2017 | Dallaire | H04L 25/03057 |

* cited by examiner

*Primary Examiner* — Khai Tran
(74) *Attorney, Agent, or Firm* — Lee & Morse, P.C.

(57) ABSTRACT

A data recovery circuit adjusts skew between a first and second clock signals when a signal level of recovered data changes relative to first reference level between a first timing of the first clock signal and a second timing of the second clock signal. Prior to adjusting the skew, a first signal level of the recovered data at the first timing is compared to a second and/or a third reference level. A second signal level at the second timing is compared to the second and/or the third reference level. The skew is adjusted based on a first sign of an error of the first signal level relative to one of the second and third reference levels. The first sign is opposite to a second sign of an error of the second signal level relative to another one of the second and third reference levels.

20 Claims, 16 Drawing Sheets

FIG. 10

| Case | rSG2 | Level[j] | Error[j] | Level[j+1] | Error[j+1] | Clock Timing | Delay Calibration |
|------|------|----------|----------|------------|------------|--------------|-------------------|
| R1 | "1" → "0" | >RV2 | + | >RV3 | + | Early | Increase |
| L1 | "1" → "0" | <RV2 | − | <RV3 | − | Late | Decrease |
| R2 | "0" → "1" | <RV3 | − | <RV2 | − | Early | Increase |
| L2 | "0" → "1" | >RV3 | + | >RV2 | + | Late | Decrease |
| — | "1" → "0" | >RV2 | + | <RV3 | − | — | Hold |
| — | "1" → "0" | <RV2 | − | >RV3 | + | — | Hold |
| — | "0" → "1" | <RV3 | − | >RV2 | + | — | Hold |
| — | "0" → "1" | >RV3 | + | <RV2 | − | — | Hold |

FIG. 13

| Case | rSG2 | Level[j] | Error[j] | Level[j+1] | Error[j+1] | Gap | Skew Calibration |
|------|------|----------|----------|------------|------------|-----|------------------|
| W1 | "1" → "0" | >RV2 | + | <RV3 | − | Wide | Decrease |
| N1 | "1" → "0" | <RV2 | − | >RV3 | + | Narrow | Increase |
| W2 | "0" → "1" | <RV3 | − | >RV2 | + | Wide | Decrease |
| N2 | "0" → "1" | >RV3 | + | <RV2 | − | Narrow | Increase |

ELECTRONIC CIRCUIT CONFIGURED TO ADJUST SKEW BETWEEN CLOCK SIGNALS

CROSS-REFERENCE TO RELATED APPLICATIONS

Korean Patent Application No. 10-2017-0104750, filed on Aug. 18, 2017, and entitled, "Electronic Circuit Configured to Adjust Skew Between Clock Signals," is incorporated by reference herein in its entirety.

BACKGROUND

1. Field

One or more embodiments described herein relate to an electronic circuit to adjust skew between clock signals.

2. Description of the Related Art

Some electronic devices have a transmitter circuit and a receiver circuit for communicating with another electronic device. The receiver circuit may receive data signals from a transmitter circuit of the other electronic device. In some cases, the receiver circuit may not directly receive a clock signal from the transmitter circuit of the other device. Instead, the receiver circuit may employ a clock and data recovery (CDR) circuit for recovering a clock signal from a received data signal. The CDR circuit may reduce the complexity of a communication channel between the transmitter circuit and the receiver circuit and may improve communication speed.

In some cases, the clock signal may be associated with the operation of the electronic device. Thus, it is a goal to have the CDR circuit exactly recover the clock signal. However, it may be difficult to exactly recover the clock signal due to an increase in communication speed, a decrease in circuit size, and/or one or more other factors.

Moreover, the circuit design of some electronic devices employ a plurality of communication lines and a plurality of clock signals in effort to improve communication speed and rapidly exchange large amounts of data. In these electronic devices it may be especially difficult to recover clock signals exactly.

SUMMARY

In accordance with one or more embodiments, an electronic circuit includes a data recovery circuit to recover data from a received signal based on at least a first clock signal and a second clock signal which provide different timings; and a clock recovery circuit to adjust skew between the first clock signal and the second clock signal when a signal level of the recovered data is changed from a level lower than a first reference level to a level higher than the first reference level, or from the level higher than the first reference level to the level lower than the first reference level, at a time point between a first timing of the first clock signal and a second timing of the second clock signal following the first timing.

The clock recovery circuit is to adjust the skew between the first clock signal and the second clock signal based on a result of a comparison between a first signal level of the recovered data at the first timing and at least one of a second reference level and a third reference level and a comparison between a second signal level of the recovered data at the second timing and at least one of the second reference level and the third reference level, the second reference level higher than the first reference level and the third reference level lower than the first reference level. The clock recovery circuit is to adjust the skew based on a first sign of an error of the first signal level with respect to one of the second and third reference levels, the first sign being opposite to a second sign of an error of the second signal level with respect to another one of the second and third reference levels.

In accordance with one or more other embodiments, an electronic circuit includes a data recovery circuit to recover data from a received signal based on at least a first clock signal and a second clock signal which provide different timings; and a clock recovery circuit to adjust skew between the first clock signal and the second clock signal when the recovered data transitions from a first data value at a first timing of the first clock signal to a second data value at a second timing of the second clock signal following the first timing. The clock recovery circuit is to adjust the skew between the first clock signal and the second clock signal based on a result of a comparison of a second reference level higher than a first reference level and a third reference level lower than the first reference level with a first signal level associated with the first data value and a second signal level associated with the second data value, the first reference level corresponding to detection of a transition of the recovered data, a second delay of the second clock signal is to increase when a first delay of the first clock signal decreases to adjust the skew, and the second delay is to decrease when the first delay increases to adjust the skew.

In accordance with one or more other embodiments, an electronic circuit includes a plurality of clock lines to transfer a plurality of clock signals based on different delays respectively; and a clock recovery circuit to adjust skew between the plurality of clock signals based on a result of a comparison of a plurality of detection reference levels with a plurality of signal levels of the data respectively, the plurality of detection reference levels being different from a transition reference level corresponding to detection of a transition of data, the plurality of signal levels of the data at a plurality of successive timings of the plurality of clock signals. The skew is adjusted based on signs of errors of the plurality of signal levels with respect to the plurality of detection reference levels being different from each other, and directions in which at least two of the different delays are adjusted to adjust the skew are different from each other.

In accordance with one or more other embodiments, a non-transitory, computer-readable medium comprising code which when executed cause a processor to perform a method of adjusting skew between a first clock signal and a second clock signal when a signal level of recovered data changes from a level lower than a first reference level to a level higher than the first reference level, or from the level higher than the first reference level to the level lower than the first reference level, at a time point between a first timing of the first clock signal and a second timing of the second clock signal following the first timing. Adjusting the skew is performed based on a result of a comparison between a first signal level of the recovered data at the first timing and at least one of a second reference level and a third reference level and a comparison between a second signal level of the recovered data at the second timing and at least one of the second reference level and the third reference level, the second reference level higher than the first reference level and the third reference level lower than the first reference level. The skew is adjusted based on a first sign of an error of the first signal level with respect to one of the second and third reference levels, the first sign being opposite to a second sign of an error of the second signal level with respect to another one of the second and third reference levels.

BRIEF DESCRIPTION OF THE DRAWINGS

Features will become apparent to those of skill in the art by describing in detail exemplary embodiments with reference to the attached drawings in which:

FIG. 10 illustrates another embodiment of a method for adjusting delays of clock signals;
FIG. 13 illustrates another embodiment for adjusting skew between clock signals.

DETAILED DESCRIPTION

Figure 1:
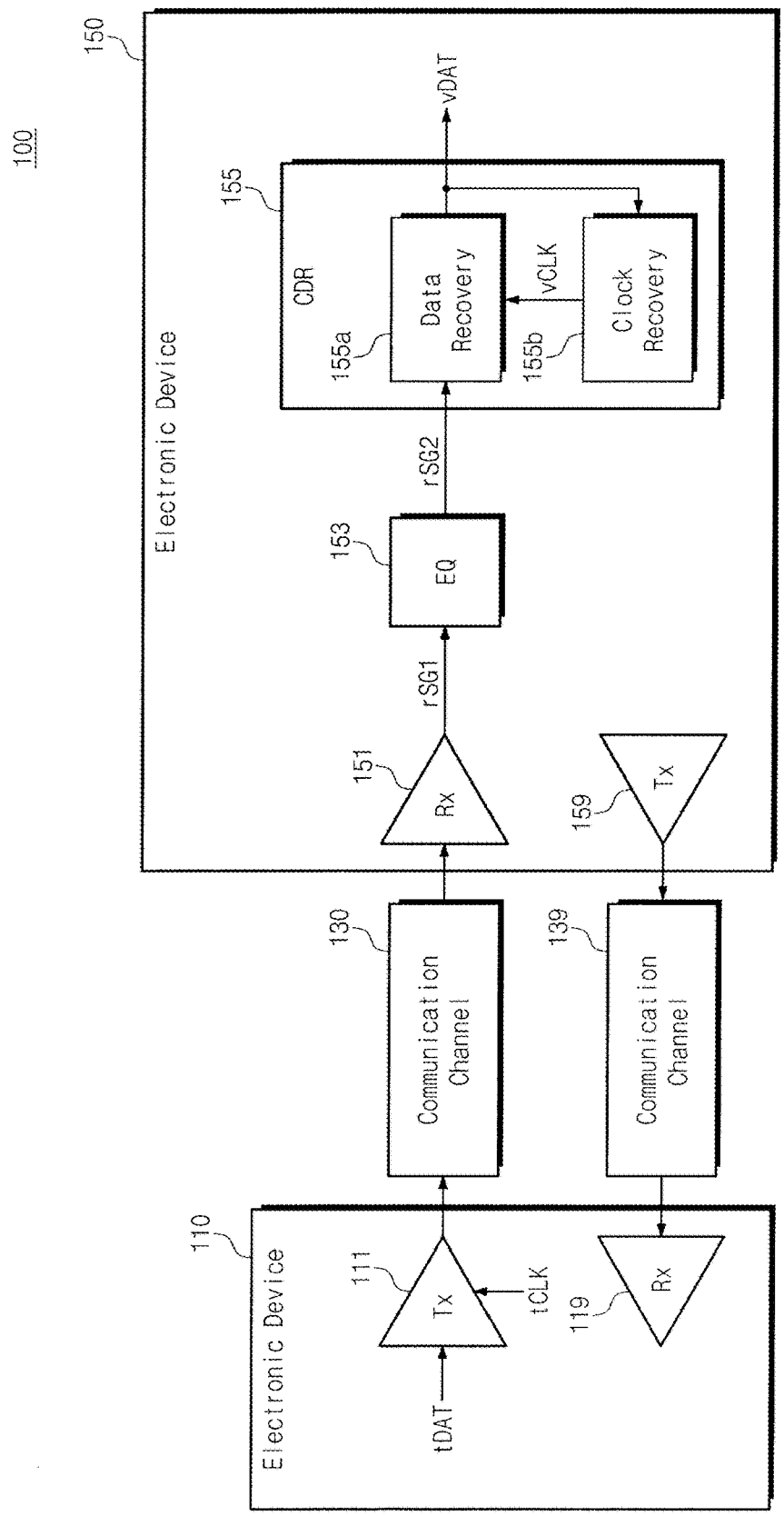
FIG. 1 illustrates an embodiment of an electronic system.

FIG. 1 illustrates an embodiment of an electronic system 100 which includes an example connection between an electronic device 150 including a clock and data recovery (CDR) circuit 155 according to one or more example embodiments herein and another electronic device 110. The electronic devices 110 and 150 may be various kinds of electronic devices. For example, each electronic device 110 and 150 may be a desktop computer, a laptop computer, a tablet computer, a smart phone, a wearable device, an electric vehicle, a workstation, a server system, and/or another type of electronic device capable of communicating signals.

The electronic device 150 may communicate with the electronic device 110 through a communication channel 130. To this end, the electronic device 110 may include a transmitter 111, and the electronic device 150 may include a receiver 151. The communication channel 130 may include a wired channel (e.g., a conductive line, a cable, a metal pattern, and/or the like) for wired communication between the electronic devices 110 and 150, and/or a wireless channel (e.g., air, water, and/or the like) for wireless communication between the electronic devices 110 and 150.

The electronic device 150 may also include a transmitter 159, and the electronic device 110 may include a receiver 119. The transmitter 159 may provide a signal to the receiver 119 through a communication channel 139. The receiver 119, the communication channel 139, and the transmitter 159 may be the same as or similar to the receiver 151, the communication channel 130, and the transmitter 111, respectively.

The transmitter 111 may output a signal corresponding to data tDAT. The data tDAT may include information generated within the electronic device 110 and that is to be transmitted to the electronic device 150. The transmitter 111 may output a signal based on a clock signal tCLK. The signal output from the transmitter 111 may be provided to the receiver 151 through the communication channel 130. Accordingly, the receiver 151 may output a signal rSG1 having a waveform corresponding to information in the transmission data tDAT.

The transmitter 111 may include various hardware circuits (e.g., an amplifier circuit, a modulator circuit, an encoder circuit, and/or the like) to suitably output the signal corresponding to transmission data tDAT. The receiver 151 may include various hardware circuits (e.g., an amplifier circuit, a demodulator circuit, a decoder circuit, and/or the like) to suitably output the signal rSG1.

The transmitter 111 and the receiver 151 may operate in compliance with one or more interface protocols depending, for example, on the type of the communication channel 130. For example, the transmitter 111 and the receiver 151 may support at least one wired communication protocol. Examples include transfer control protocol/Internet protocol (TCP/IP), universal serial bus (USB), Firewire, and/or another protocol. Additionally, or alternatively, the transmitter 111 and the receiver 151 may support at least one wireless communication protocol. Examples include long term evolution (LTE), worldwide interoperability for microwave access (WIMAX), global system for mobile communications (GSM), code division multiple access (CDMA), Bluetooth, wireless fidelity (Wi-Fi), radio frequency identification (RFID), and/or the like.

FIG. 1 illustrates that the electronic device 150 includes one receiver 151 and one transmitter 159. In one embodiment, the electronic device 150 may include a plurality of receivers and/or a plurality of transmitters to improve performance of communication.

The signal rSG1 may be provided to an equalizer 153. In some examples, when high-speed communication is provided through the communication channel 130, intensity of a specific frequency band with regard to the signal rSG1 may be attenuated. The equalizer 153 may compensate for the signal of the attenuated intensity, and thus may output a signal rSG2. The signal rSG2 may have intensity which is suitable to be processed in the electronic device 150.

The CDR circuit 155 may receive the signal rSG2. The CDR circuit 155 may include a data recovery circuit 155a and a clock recovery circuit 155b. The CDR circuit 155 may be implemented with an electronic circuit including various analog/digital circuits to perform operations, for example, as described below.

The data recovery circuit 155a may recover data vDAT from the signal rSG2. The recovered data vDAT may correspond to the data tDAT which the electronic device 110 intends to transmit to the electronic device 150. The electronic device 150 may provide its own functions based on the recovered data vDAT.

The data recovery circuit 155a may sample the signal rSG2 at respective timings provided by a clock signal vCLK (e.g., each rising edge or each falling edge of the clock signal vCLK) in order to recover the data vDAT. Accordingly, the data recovery circuit 155a may generate the data vDAT based on the clock signal vCLK.

The electronic device 150 may receive a signal corresponding to the data tDAT from the electronic device 110. However, the electronic device 150 may not receive a signal corresponding to the clock signal tCLK or the clock signal vCLK. Instead, the electronic device 150 may recover the clock signal vCLK by the clock recovery circuit 155b.

The clock recovery circuit 155b may recover the clock signal vCLK based on the recovered data vDAT, and in one embodiment based on a transition of a data value of the recovered data vDAT. The transition of the data value of the recovered data vDAT may provide an edge of the clock signal vCLK. Thus, the clock signal vCLK may have a waveform suitable for recovering the data vDAT. Such operations of the clock recovery circuit 155b may be readily performed using a variety of recovery techniques.

Figure 2:
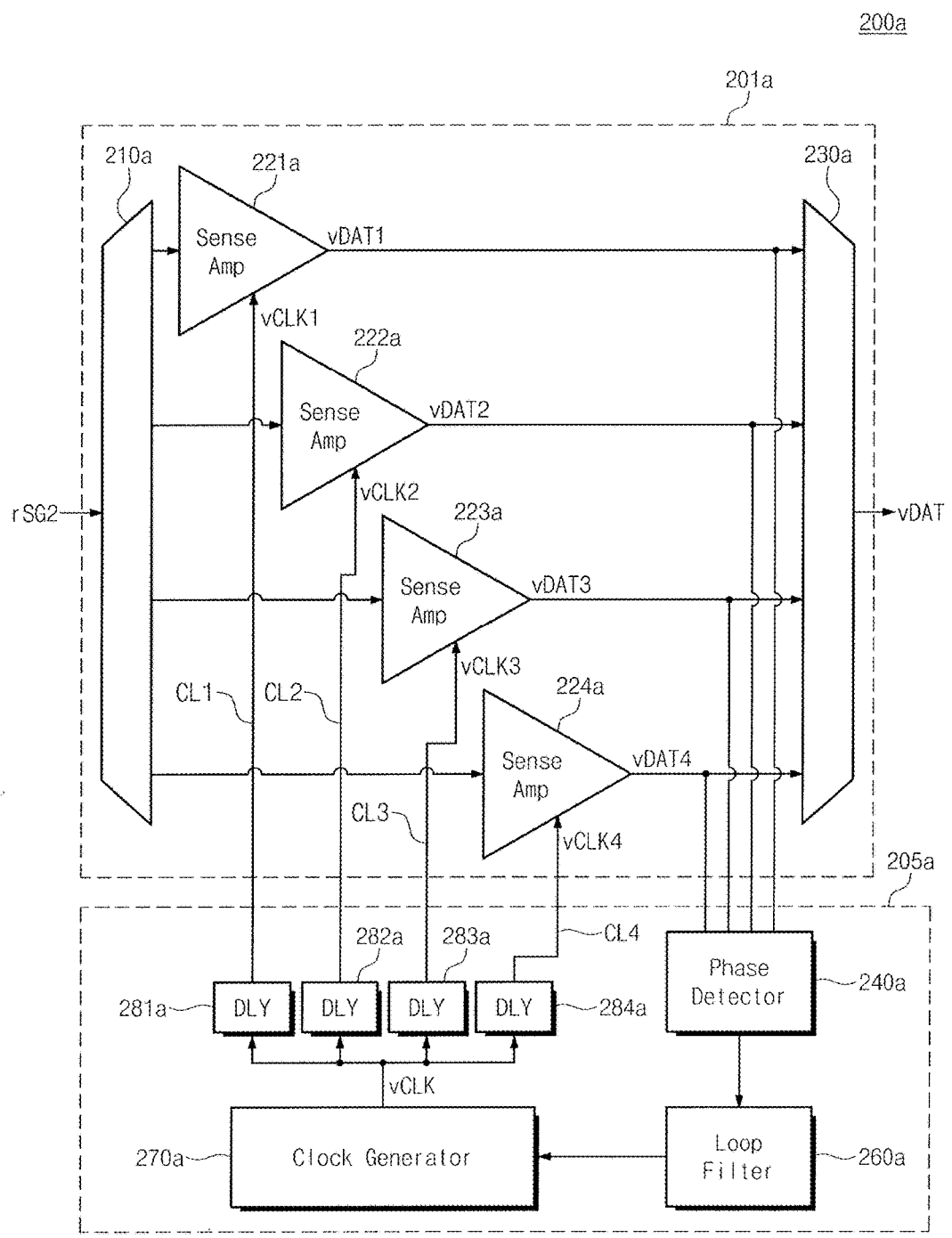
FIG. 2 illustrates an embodiment of a CDR circuit.

FIG. 2 illustrates an embodiment of the CDR circuit 155 which may include a CDR circuit 200a. The CDR circuit 200a may include a data recovery circuit 201a and a clock recovery circuit 205a. The data recovery circuit 201a and the clock recovery circuit 205a may correspond to the data recovery circuit 155a and the clock recovery circuit 155b of FIG. 1 respectively.

The data recovery circuit 201a may include switches 210a and 230a and sense amplifiers 221a. 222a, 223a, and 224a. The switch 210a may receive the signal rSG2. The switch 210a may provide the signal rSG2 to the sense amplifiers 221a, 222a, 223a, and 224a. According to an operation of the switch 210a, the signal rSG2 may be provided to a sense amplifier for sampling the signal rSG2.

The sense amplifiers 221a, 222a, 223a, and 224a may sample the signal rSG2 based on respective clock signals vCLK1, vCLK2, vCLK3, and vCLK4, and thus may output data vDAT1, vDAT2, vDAT3, and vDAT4 respectively. The signal rSG2 may be sampled at each of timings provided by the clock signals vCLK1, vCLK2, vCLK3, and vCLK4.

The switch 230a may receive the data vDAT1, vDAT2, vDAT3, and vDAT4. The switch 230a may output the data vDAT based on the data vDAT1, vDAT2, vDAT3, and vDAT4. Accordingly, the data recovery circuit 201a may recover the data vDAT from the signal rSG2.

The clock signals vCLK1, vCLK2, vCLK3, and vCLK4 may provide different timings. For example, edges of the clock signals vCLK1, vCLK2, vCLK3, and vCLK4 may be time-interleaved, for example, as described with reference to FIGS. 4 and 5.

When high performance of communication is required, it may be requested to employ a clock signal of a high frequency. However, it may be physically difficult to implement a clock signal of a significantly high frequency. Accordingly, the plurality of clock signals vCLK1, vCLK2, vCLK3, and vCLK4 may be time-interleaved. Even though each of the plurality of clock signals vCLK1, vCLK2, vCLK3, and vCLK4 has a low frequency, the plurality of clock signals vCLK1, vCLK2, vCLK3, and vCLK4 may provide timings sufficient to sample the signal rSG2.

The clock recovery circuit 205a may include a phase detector 240a, a loop filter 260a, and a clock generator 270a. The phase detector 240a may detect a transition of a data value from some or all of the data vDAT1, vDAT2, vDAT3, and vDAT4. In some example embodiments, the phase detector 240a may detect a transition of a data value from the data vDAT. An output of the phase detector 240a may be provided to the loop filter 260a.

The loop filter 260a may filter specific frequency component(s) of a signal which flows along a loop of the clock recovery circuit 205a. For example, the loop filter 260a may cut off frequency component(s) not suitable for recovering a clock signal. An output of the loop filter 260a may be provided to the clock generator 270a.

The clock generator 270a may generate the clock signal vCLK based on the transition detected by the phase detector 240a. The clock signal vCLK may include edges corresponding to transitions of data values of some or all of the data vDAT1, vDAT2, vDAT3, and vDAT4. The clock signal vCLK may be provided to delay circuits 281a, 282a, 283a, and 284a.

Each of the delay circuits 281a, 282a, 283a, and 284a may delay the clock signal vCLK. The clock signals vCLK1, vCLK2, vCLK3, and vCLK4 may be generated from the clock signal vCLK and may be output through the delay circuits 281a, 282a, 283a, and 284a, respectively. Accordingly, the clock recovery circuit 205a may recover the clock signals vCLK1, vCLK2, vCLK3, and vCLK4 based on transitions of data values of the recovered data vDAT1, vDAT2, vDAT3, and vDAT4.

In some example embodiments, some or all of the delay circuits 281a, 282a, 283a, and 284a may be in the data recovery circuit 201a. In some example embodiments, some or all of the delay circuits 281a, 282a, 283a, and 284a may be provided separately from the data recovery circuit 201a and the clock recovery circuit 205a.

Figure 4:
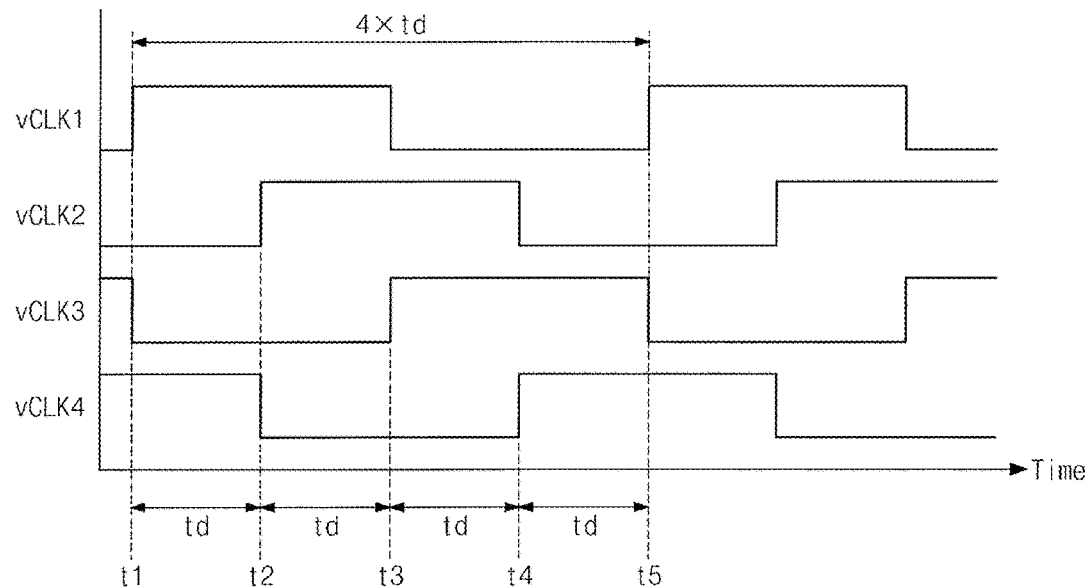
FIG. 4 illustrates an embodiment of a timing diagram for a CDR circuit.

The CDR circuit 200a may include clock lines CL1, CL2, CL3, and CL4 to transfer the clock signals vCLK1, vCLK2, vCLK3, and vCLK4 to the sense amplifiers 221a. 222a, 223a, and 224a respectively. Delays provided by the delay circuits 281a, 282a, 283a, and 284a may be different from each other. Accordingly, the clock lines CL1, CL2, CL3, and CL4 may respectively transfer the clock signals vCLK1, vCLK2, vCLK3, and vCLK4 based on different delays. The clock signals vCLK1, vCLK2, vCLK3, and vCLK4 may provide different timings as illustrated in FIG. 4.

Figure 3:
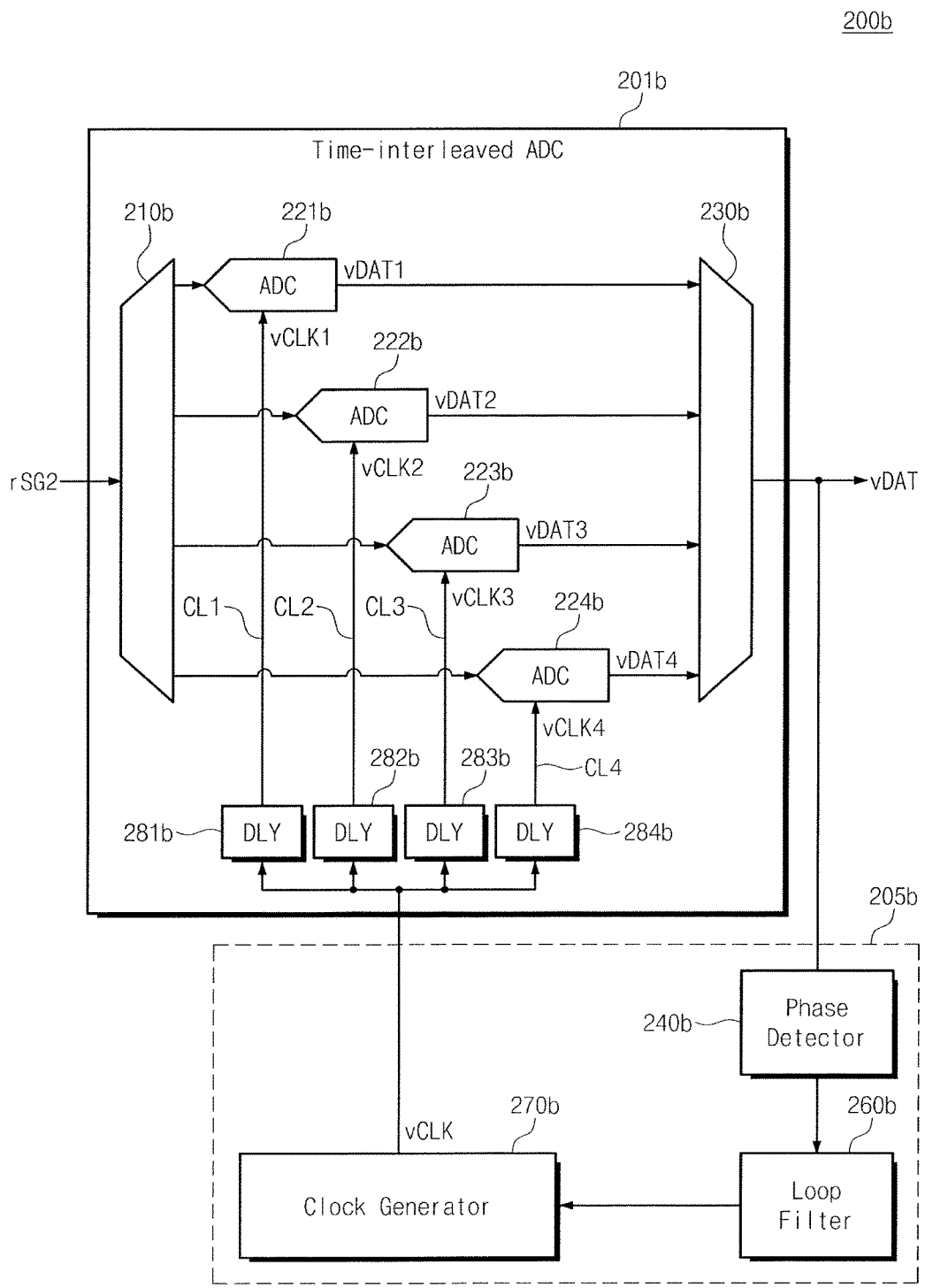
FIG. 3 illustrates another embodiment of a CDR circuit.

FIG. 3 illustrates an example configuration of the CDR circuit 155 of FIG. 1. In some example embodiments, CDR circuit 155 of FIG. 1 may include a CDR circuit 200b of FIG. 3.

The CDR circuit 200b may include a data recovery circuit 201b and a clock recovery circuit 205b. The data recovery circuit 201b and the clock recovery circuit 205b may correspond to the data recovery circuit 155a and the clock recovery circuit 155b of FIG. 1 respectively.

The data recovery circuit 201b may include switches 210b and 230b and analog-to-digital converters (ADCs) 221b, 222b, 223b, and 224b. The switches 210b and 230b may be the same as or similar to the switches 210a and 230a of FIG. 2.

The ADCs 221b, 222b, 223b, and 224b may convert the signal rSG2 to the data vDAT1, vDAT2, vDAT3, and vDAT4 based on respective clock signals vCLK1, vCLK2, vCLK3, and vCLK4. For example, edges of the clock signals vCLK1, vCLK2, vCLK3, and vCLK4 may be time-interleaved, and the data recovery circuit 201b may be provided as a time-interleaved ADC (TIADC). The data recovery circuit 201b may convert the signal rSG2 to the data vDAT.

The clock signals vCLK1, vCLK2, vCLK3, and vCLK4 may be provided from delay circuits 281b, 282b. 283b, and 284b respectively. Each of the delay circuits 281b, 282b, 283b, and 284b may delay the clock signal vCLK from the clock recovery circuit 205b.

Delays provided by the delay circuits 281b, 282b, 283b, and 284b may be different from each other. Accordingly, the clock lines CL1. CL2, CL3, and CL4 may respectively transfer the clock signals vCLK1, vCLK2, vCLK3, and vCLK4 to the ADCs 221b, 222b, 223b, and 224b based on different delays. The clock signals vCLK1, vCLK2, vCLK3, and vCLK4 may provide different timings as illustrated in FIG. 4.

In some example embodiments, some or all of the delay circuits 281b, 282b, 283b, and 284b may be in the clock recovery circuit 205b. In some example embodiments, some or all of the delay circuits 281b, 282b, 283b, and 284b may be provided separately from the data recovery circuit 201b and the clock recovery circuit 205b.

The clock recovery circuit 205b may include a phase detector 240b, a loop filter 260b, and a clock generator 270b. The phase detector 240b, the loop filter 260b, and the clock generator 270b may be the same as or similar to the phase detector 240a, the loop filter 260a, and the clock generator 270a of FIG. 2.

The clock recovery circuit 205b may recover the clock signal vCLK based on a transition of a data value of the recovered data vDAT. In some example embodiments, the clock recovery circuit 205b may recover the clock signal vCLK from some or all of the data vDAT1, vDAT2, vDAT3, and vDAT4.

The CDR circuit 200a of FIG. 2 or the CDR circuit 200b of FIG. 3 may include a plurality of data paths (e.g., through the sense amplifiers 221a, 222a, 223a, and 224a or the ADCs 221b, 222b, 223b, and 224b), and may include a plurality of clock paths (e.g., through the clock lines CL1, CL2, CL3, and CL4). FIGS. 2 and 3 illustrate four data paths and four clock paths. The number of data paths and the number of clock paths may be different or modified in other embodiments. In FIGS. 2 and 3, the phase detectors and/or error detectors may operate based on one or more reference levels, as in additional embodiments to be discussed below.

Figure 5:
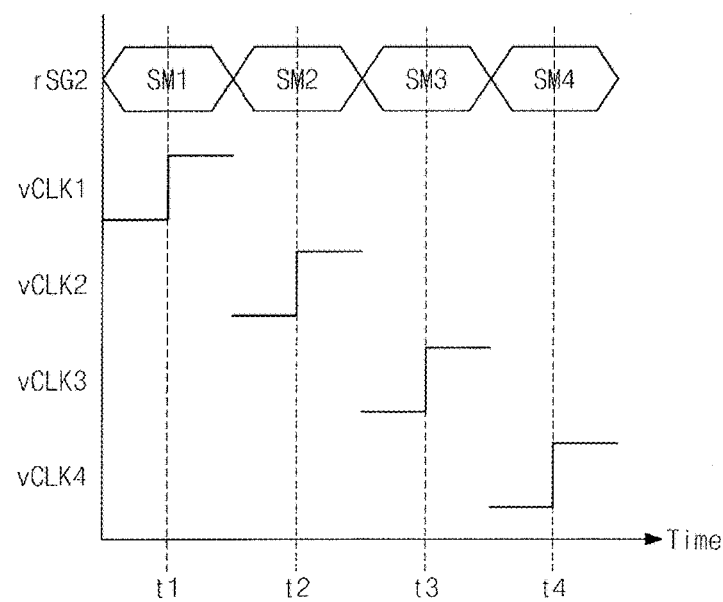
FIG. 5 illustrates the timing and skew of clock signals according to one embodiment.

FIG. 4 illustrates an embodiment of a timing diagram for the example clock signals vCLK1, vCLK2, vCLK3, and vCLK4 which are dealt with in the CDR circuit 200a of FIG. 2 or in the CDR circuit 200b of FIG. 3. FIG. 5 illustrate an embodiment of a timing diagram indicative of timings and skew associated with the example clock signals vCLK1, vCLK2, vCLK3, and vCLK4 of FIG. 4.

Referring to FIG. 4, the clock signals vCLK1, vCLK2, vCLK3, and vCLK4 may provide different timings (e.g., sampling timings). For example, the clock signals vCLK1, vCLK2, vCLK3, and vCLK4 may have rising edges at time t1, t2, t3, and t4 respectively.

Accordingly, referring to FIG. 5, the sense amplifiers 221a, 222a, 223a, and 224a of FIG. 2 or the ADCs 221b, 222b, 223b, and 224b of FIG. 3 may sample the signal rSG2 at the time t1, t2, t3, and t4 respectively (for illustrative purposes, it is assumed that the signal rSG2 is sampled at a rising edge). For example, time t1 may provide a timing for sampling the center of a symbol SM1 in the signal rSG2 by the sense amplifier 221a or the ADC 221b. Similarly, time t2, t3, and t4 may provide timings for sampling symbols SM2, SM3, and SM4. For example, the clock signals vCLK1, vCLK2, vCLK3, and vCLK4 may be a Baud-rate clock signal.

Returning to FIG. 4, the clock signals vCLK1, vCLK2, vCLK3, and vCLK4 may be time-interleaved. For example, skew of td may be provided between the clock signals vCLK1, vCLK2, vCLK3, and vCLK4. Accordingly, time intervals of td may be observed between time t1, t2, t3, t4, and t5 at which timings are provided by the clock signals vCLK1, vCLK2, vCLK3, and vCLK4.

The period of each of the clock signals vCLK1, vCLK2, vCLK3, and vCLK4 may be a predetermined number of (e.g., four) times td. However, as the clock signals vCLK1, vCLK2, vCLK3, and vCLK4 are time-interleaved, sampling timings may be provided for each and every time interval of td. In some cases, it may be physically easier to implement the clock signals vCLK2, vCLK3, and vCLK4 to have the same frequency as the clock signal vCLK1, than to implement a clock signal having the frequency which is the predetermined number of (e.g., four) times higher than the clock signal vCLK1.

To exactly and reliably recover the data vDAT1, vDAT2, vDAT3, and vDAT4 from the signal rSG2, it may be a goal to uniformly maintain the skew of td between the clock signals vCLK1, vCLK2, vCLK3, and vCLK4. However, this may not be practically possible in all cases. For example, circuit design issues (e.g., element characteristics, differences between physical lengths of the clock lines CL, CL2, CL3, and CL4, and/or other factors), process-voltage-temperature (PVT) variations, and/or other influences may affect skew between and among the clock signals vCLK1, vCLK2, vCLK3, and vCLK4.

Figure 6:
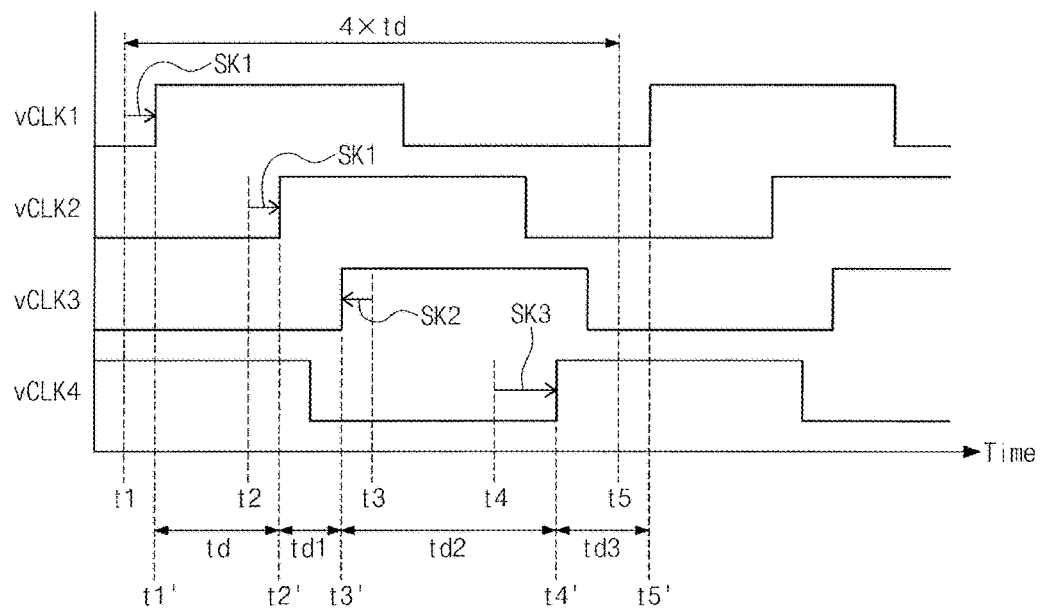
FIG. 6 illustrates another embodiment of a timing diagram for a CDR circuit.
Figure 7:
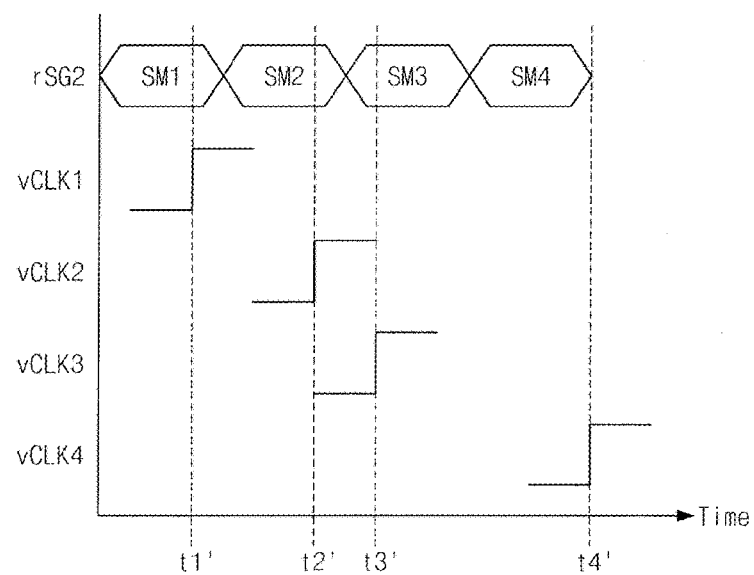
FIG. 7 illustrates the timing and skew of clock signals according to another embodiment.

FIG. 6 illustrates an embodiment of a timing diagram of example clock signals vCLK1, vCLK2, vCLK3, and vCLK4 which are dealt with in the CDR circuit 200a of FIG. 2 or in the CDR circuit 200b of FIG. 3. FIG. 7 illustrates an embodiment of a timing diagram of timings and skew associated with the example clock signals vCLK1, vCLK2, vCLK3, and vCLK4 of FIG. 6.

As described above, various causes may affect skew between and among the clock signals vCLK1, vCLK2, vCLK3, and vCLK4 and/or the delay associated with each of the clock signals vCLK1, vCLK2, vCLK3, and vCLK4. In a circuit design which employs a plurality of clock paths (e.g., a half-rate or quarter-rate clock scheme, a TIADC-based CDR, and/or the like), when a clock signal is not transferred as intended, margin of a sampling timing may become insufficient or setup/hold time may become unsuitable. Accordingly, the CDR circuit 200a or 200b may become vulnerable to jitter or other forms of noise. In some cases, unintended data may be sampled, and the CDR circuit 200a or 200b may operate unstably.

Referring to FIG. 6, for example, transferring the clock signals vCLK1 and vCLK2 may be late by time SK1. For example, transferring the clock signal vCLK3 may be early by time SK2, and transferring the clock signal vCLK4 may be late by time SK3. In this case, timings may be provided by the clock signals vCLK1, vCLK2, vCLK3, and vCLK4 at respective time t1', t2', t3', t4', and t5', not at the intended times t1, t2, t3, t4, and t5. In addition, skew between the clock signals vCLK1, vCLK2, vCLK3, and vCLK4 may be td, td1, td2, and td3, i.e., they may become non-uniform (skew mismatch).

Referring to FIG. 7, the sense amplifiers 221a, 222a, 223a, and 224a of FIG. 2 or the ADCs 221b, 222b, 223b, and 224b of FIG. 3 may sample the signal rSG2 at time t1', t2', t3', and t4' respectively. However, setup/hold time of the clock signals vCLK1, vCLK2, and vCLK3 may not be suitable for sampling the symbols SM1, SM2, and SM3. In addition, the clock signal vCLK4 may fail to sample the symbol SM4. The timing error and the skew mismatch may cause an unintended or unexpected operation. These differences may become more severe as communication speeds increase.

Example embodiments of the present disclosure may detect and calibrate the timing error and the skew mismatch of the clock signals vCLK1, vCLK2, vCLK3, and vCLK4. Accordingly, the clock signals vCLK1, vCLK2, vCLK3, and vCLK4 may be recovered exactly, and stability and reliability of an operation of the CDR circuit 200a or 200b may be improved. Herein, "clock signals are recovered exactly" may mean that the clock signals are recovered such that the skew between and among the clock signals become uniform to provide respective intended timings. As the clock signals are recovered exactly, there may be no difference between actual timings provided from respective clock signals and the intended timings. In some cases, a little tolerance may be acceptable between the actual timings and the intended timings if there is no problem to recover data based on the actual timings.

Figure 8:
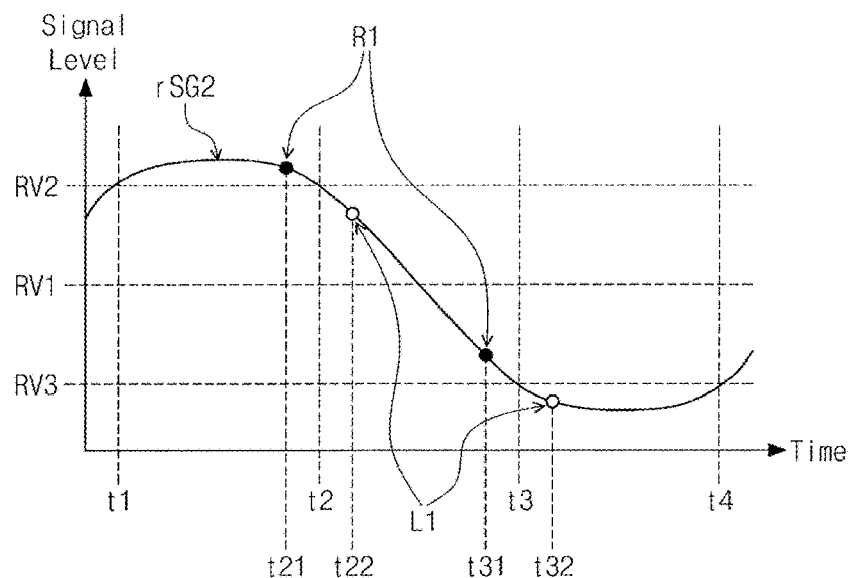
FIGS. 8 and 9 illustrate an embodiment of a method for adjusting delays of clock signals.
Figure 9:
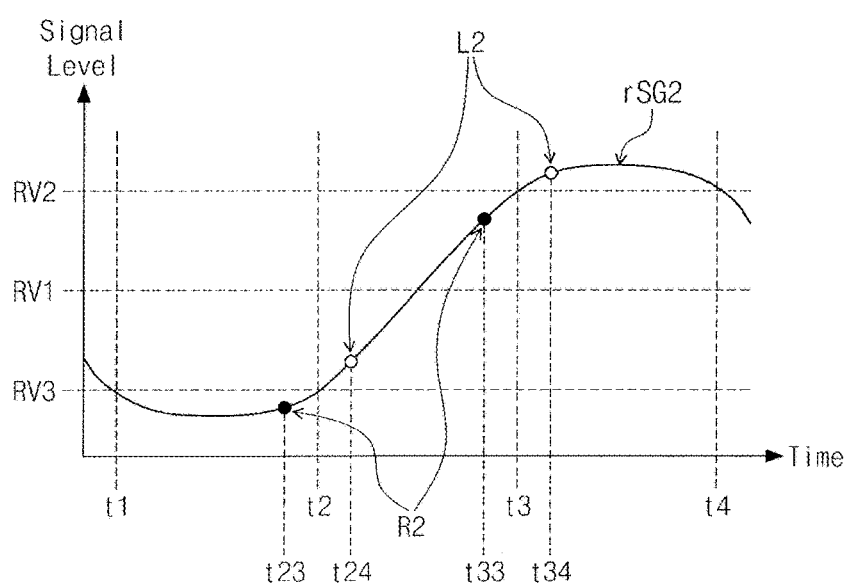

FIGS. 8 and 9 are graphs illustrating embodiments of a method for adjusting delays of the clock signals vCLK1, vCLK2, vCLK3, and vCLK4 of FIG. 6. FIG. 10 illustrates an example of a table corresponding to an example method for adjusting delays of the clock signals vCLK1, vCLK2, vCLK3, and vCLK4 with regard to the graphs of FIGS. 8 and 9.

Referring to FIGS. 8 and 9, the signal level of the signal rSG2 may vary over time. For example, the signal level may be a voltage level or another type of level. The signal level of the signal rSG2 may vary depending on a data value. For example, when the signal rSG2 is intended to indicate a first data value (e.g., logic 1), the signal level of the signal rSG2 may be higher than a reference level RV1. When the signal rSG2 is intended to indicate a second data value (e.g., logic 0), the signal level of the signal rSG2 may be lower than the reference level RV1.

The signal rSG2 may be sampled at respective timings provided by the clock signals vCLK1, vCLK2, vCLK3, and vCLK4, and thus the data vDAT may be recovered. The recovered data vDAT may have a signal level of the sampled signal rSG2. The data vDAT may have a data value corresponding to the signal level, e.g., the signal level may be associated with the data value. For example, when the signal level of the sampled signal rSG2 is higher than the reference level RV1, the data vDAT may be recovered to have the first data value. When the signal level of the sampled signal rSG2 is lower than the reference level RV1, the data vDAT may be recovered to have the second data value.

With regard to the example of FIG. 8, the signal level of the data vDAT may change from a level higher than the reference level RV1 to a level lower than the reference level RV1. In this case, it may be understood that the data vDAT transitions from the first data value (e.g., logic 1) to the second data value (e.g., logic 0). With regard to the example of FIG. 9, the signal level of the data vDAT may change from a level lower than the reference level RV1 to a level higher than the reference level RV1. In this case, it may be understood that the data vDAT transitions from the second data value to the first data value.

The reference level RV1 may be associated with detecting a transition of the data vDAT, e.g., a transition of a data value. The signal level of the data vDAT may be compared with the reference level RV1 to detect a transition of the data vDAT. In the present disclosure, the reference level RV1 may also be referred to as a transition reference level.

Reference levels RV2 and RV3 may be further employed to detect the timing error and the skew mismatch of the clock signals vCLK1, vCLK2, vCLK3, and vCLK4. The reference level RV2 may be higher than the reference value RV1, and the reference level RV3 may be lower than the reference level RV1. The reference levels RV2 and RV3 may be compared with the signal level of the data vDAT to detect the timing error and the skew mismatch of the clock signals vCLK1, vCLK2, vCLK3, and vCLK4. Each of the reference levels RV2 and RV3 may also be referred to as a detection reference level.

For example, referring to FIG. 8, it may be intended that the signal rSG2 is sampled at successive timings (e.g., time t2 and t3). However, the timing error and the skew mismatch may occur due to various causes, and the signal rSG2 may be sampled at unintended timings.

In some cases, the signal rSG2 may be sampled at timings which are earlier than intended timings. Referring to sampling points R1 of FIG. 8, the signal rSG2 may be sampled at time t21 and time t31 which follows time t21. For example, the timing of time t21 may be provided by the clock signal vCLK2, and the timing of time t31 may be provided by the clock signal vCLK3. For example, the signal level of the data vDAT at time t21 may be higher than the reference level RV2, and the signal level of the data vDAT at time t31 may be higher than the reference level RV3.

Accordingly, an error of the signal level of the data vDAT with respect to the reference level RV2 at time t21 may be positive, and an error of the signal level of the data vDAT with respect to the reference level RV3 at time t31 may be positive. An error of a signal level with respect to a reference level may correspond to a value obtained by subtracting a reference level from a signal level, e.g., may correspond to a difference between the signal level and the reference level.

In some cases, the signal rSG2 may be sampled at timings which are later than intended timings. Referring to sampling points L1 of FIG. 8, the signal rSG2 may be sampled at time t22 and time t32 which follows time t22. For example, the timing of time t22 may be provided by the clock signal vCLK2, and the timing of time t32 may be provided by the clock signal vCLK3.

For example, the signal level of the data vDAT at time t22 may be lower than the reference level RV2, and the signal level of the data vDAT at time t32 may be lower than the reference level RV3. Accordingly, an error of the signal level of the data vDAT with respect to the reference level RV2 at time t22 may be negative, and an error of the signal level of the data vDAT with respect to the reference level RV3 at time t32 may be negative.

Referring to FIG. 10, observed values associated with the sampling points R1 and L1 are illustrated. The sampling points R1 and L1 may be associated with a case where the signal rSG2 transitions from the first data value (e.g., logic 1) to the second data value (e.g., logic 0) between a preceding timing and a following timing which succeeds the preceding timing.

In this case, a positive error at the preceding timing and a positive error at the following timing may mean that actual timings are earlier than intended timings (refer to the sampling points R1 of FIG. 8). Accordingly, the CDR circuit 200a of FIG. 2 or the CDR circuit 200b of FIG. 3 may increase delays of the clock signals vCLK1, vCLK2, vCLK3, and vCLK4, such that timings provided by the clock signals vCLK1, vCLK2, vCLK3, and vCLK4 become later.

A negative error at the preceding timing and a negative error at the following timing may mean that actual timings are later than intended timings (refer to the sampling points L of FIG. 8). Accordingly, the CDR circuit 200a of FIG. 2 or the CDR circuit 200b of FIG. 3 may decrease delays of the clock signals vCLK1, vCLK2, vCLK3, and vCLK4, such that timings provided by the clock signals vCLK1, vCLK2, vCLK3, and vCLK4 become earlier.

Referring to FIG. 9, in some cases, the signal rSG2 may be sampled at timings which are earlier than intended timings. For example, referring to sampling points R2 of FIG. 9, the signal rSG2 may be sampled at time t23 and time t33 which follows time t23. For example, the timing of time t23 may be provided by the clock signal vCLK2, and the timing of time t33 may be provided by the clock signal vCLK3.

For example, the signal level of the data vDAT at time t23 may be lower than the reference level RV3, and the signal level of the data vDAT at time t33 may be lower than the reference level RV2. Accordingly, an error of the signal level of the data vDAT with respect to the reference level RV3 at time t23 may be negative, and an error of the signal level of the data vDAT with respect to the reference level RV2 at time t33 may be negative.

In some cases, the signal rSG2 may be sampled at timings which are later than intended timings. For example, referring to sampling points L2 of FIG. 9, the signal rSG2 may be sampled at time t24 and time t34 which follows time t24. For example, the timing of time t24 may be provided by the clock signal vCLK2, and the timing of time t34 may be provided by the clock signal vCLK3. For example, the signal level of the data vDAT at time t24 may be higher than the reference level RV3, and the signal level of the data vDAT at time t34 may be higher than the reference level RV2. Accordingly, an error of the signal level of the data vDAT with respect to the reference level RV3 at time t24 may be positive, and an error of the signal level of the data vDAT with respect to the reference level RV2 at time t34 may be positive.

Referring to FIG. 10, observed values associated with the sampling points R2 and L2 are illustrated. The sampling points R2 and L2 may be associated with a case where the signal rSG2 transitions from the second data value (e.g., logic 0) to the first data value (e.g., logic 1) between a preceding timing and a following timing which succeeds the preceding timing.

In this case, a negative error at the preceding timing and a negative error at the following timing may mean that actual timings are earlier than intended timings (e.g., refer to the sampling points R2 of FIG. 9). Accordingly, the CDR circuit 200a of FIG. 2 or the CDR circuit 200b of FIG. 3 may increase delays of the clock signals vCLK1, vCLK2, vCLK3, and vCLK4, such that timings provided by the clock signals vCLK1, vCLK2, vCLK3, and vCLK4 become later.

A positive error at the preceding timing and a positive error at the following timing may mean that actual timings are later than intended timings (e.g., refer to the sampling points L2 of FIG. 9). Accordingly, the CDR circuit 200a of FIG. 2 or the CDR circuit 200b of FIG. 3 may decrease delays of the clock signals vCLK1, vCLK2, vCLK3, and vCLK4, such that timings provided by the clock signals vCLK1, vCLK2, vCLK3, and vCLK4 become earlier.

The CDR circuit 200a of FIG. 2 or the CDR circuit 200b of FIG. 3 may detect the timing error based on a result of comparing the reference levels RV2 and RV3 (which are different from the reference level RV1) with signal levels of the data vDAT at successive timings of the clock signals vCLK1, vCLK2, vCLK3, and vCLK4. In addition, the CDR circuit 200a of FIG. 2 or the CDR circuit 200b of FIG. 3 may adjust or calibrate (e.g., increase or decrease) delays of the clock signals vCLK1, vCLK2, vCLK3, and vCLK4 to resolve the detected timing error. Values of the reference levels RV2 and RV3 may be selected to be suitable for detecting the timing error.

In the examples of FIGS. 8 to 10, delays of the clock signals vCLK1, vCLK2, vCLK3, and vCLK4 may be adjusted in the same direction. For example, the delays of the clock signals vCLK1, vCLK2, vCLK3, and vCLK4 may increase or decrease together. Adjusting these delays may be based on a sign of an error at a preceding timing being the same as a sign of an error at a following timing. In the examples of FIGS. 8 to 10, the CDR circuit 200a of FIG. 2 or the CDR circuit 200b of FIG. 3 may include, for example, a Mueller-Muller CDR (MMCDR).

Referring to FIG. 10, in some cases, a sign of an error at a preceding timing may be different from (e.g., opposite to) a sign of an error at a following timing. In these cases, it may be difficult to determine whether timings provided by the clock signals vCLK1, vCLK2, vCLK3, and vCLK4 are earlier or later than intended timings.

For example, with regard to FIG. 8, when the signal rSG2 is sampled at time t21 and t32, an error of the signal level of the data vDAT with respect to the reference level RV2 at time t21 may be positive, and an error of the signal level of the data vDAT with respect to the reference level RV3 at time t32 may be negative. In this case, an actual timing at time t21 may be earlier than an intended timing at time t2, while an actual timing at time t32 may be later than an intended timing at time t3. Accordingly, in some example embodiments, this case may not be referenced to adjust delays of the clock signals vCLK1, vCLK2, vCLK3, and vCLK4 in the same direction, and the delays of the clock signals vCLK1, vCLK2, vCLK3, and vCLK4 may be held.

As will be described with reference to FIGS. 11 to 13, the cases where a sign of an error at a preceding timing is different from a sign of an error at a following timing may be referenced to adjust skew between the clock signals vCLK1, vCLK2, vCLK3, and vCLK4.

Figure 11:
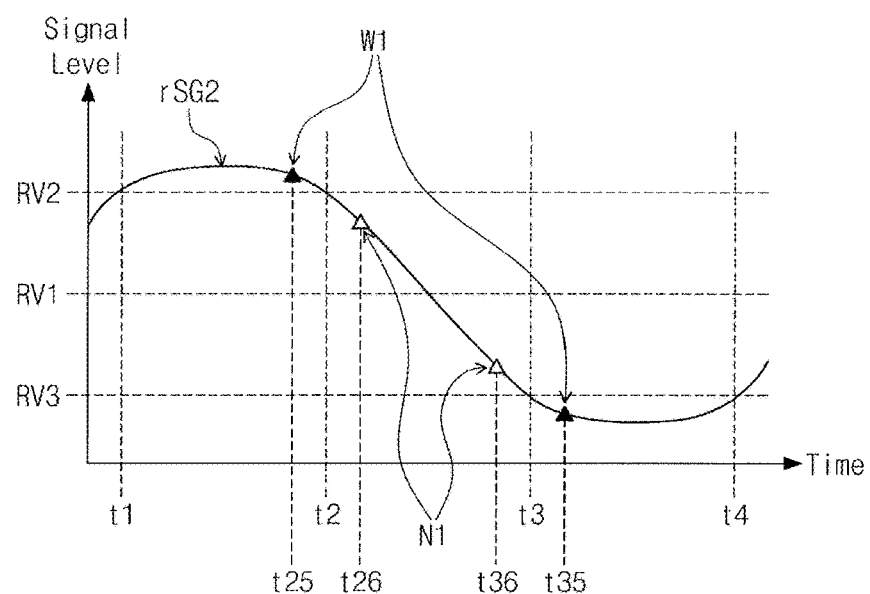
FIGS. 11 and 12 illustrate an embodiment for adjusting skew between clock signals.
Figure 12:
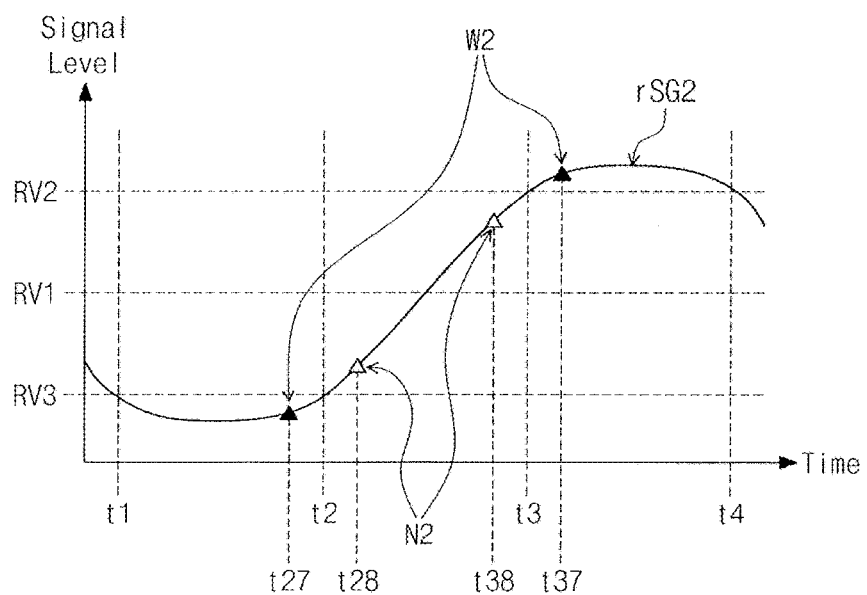

FIGS. 11 and 12 are graphs illustrating additional example methods for adjusting skew between the clock signals vCLK1, vCLK2, vCLK3, and vCLK4 of FIG. 6. FIG. 13 illustrates an example of table corresponding to an embodiment of a method for adjusting skew between the clock signals vCLK1, vCLK2, vCLK3, and vCLK4 with regard to the graphs of FIGS. 11 and 12.

Similar to FIG. 8, with regard to an example of FIG. 11, a signal level of the data vDAT may change from a level higher than the reference level RV1 to a level lower than the reference level RV1. In some cases, the signal rSG2 may be sampled at timings having an interval wider than an interval between intended timings (e.g., time t2 and t3). Referring to sampling points W1 of FIG. 11, the signal rSG2 may be sampled at time t25 and time t35 which follows time t25. For example, the timing of time t25 may be provided by the clock signal vCLK2, and the timing of time t35 may be provided by the clock signal vCLK3.

For example, the signal level of the data vDAT at time t25 may be higher than the reference level RV2, and the signal level of the data vDAT at time t35 may be lower than the reference level RV3. Accordingly, an error of the signal level of the data vDAT with respect to the reference level RV2 at time t25 may be positive, and an error of the signal level of the data vDAT with respect to the reference level RV3 at time t35 may be negative.

In some cases, the signal rSG2 may be sampled at timings having an interval narrower than an interval between intended timings. Referring to sampling points N1 of FIG. 11, the signal rSG2 may be sampled at time t26 and time t36 which follows time t26. For example, the timing of time t26 may be provided by the clock signal vCLK2, and the timing of time t36 may be provided by the clock signal vCLK3. For example, the signal level of the data vDAT at time t26 may be lower than the reference level RV2, and the signal level of the data vDAT at time t36 may be higher than the reference level RV3. Accordingly, an error of the signal level of the data vDAT with respect to the reference level RV2 at time t26 may be negative, and an error of the signal level of the data vDAT with respect to the reference level RV3 at time t36 may be positive.

Referring to FIG. 13, observed values associated with the sampling points W1 and N1 are illustrated. The sampling points W1 and N1 may be associated with a case where the signal rSG2 transitions from the first data value (e.g., logic 1) to the second data value (e.g., logic 0) between a preceding timing and a following timing which succeeds the preceding timing.

In this case, a positive error at the preceding timing and a negative error at the following timing may mean that an interval between actual timings is wider than an interval between intended timings (e.g., refer to the sampling points W1 of FIG. 11). Accordingly, the CDR circuit 200a of FIG. 2 or the CDR circuit 200b of FIG. 3 may decrease skew between clock signals, such that an interval between timings provided by the clock signals becomes narrower.

A negative error at the preceding timing and a positive error at the following timing may mean that an interval between actual timings is narrower than an interval between intended timings (e.g., refer to the sampling points N1 of FIG. 11). Accordingly, the CDR circuit 200a of FIG. 2 or the CDR circuit 200b of FIG. 3 may increase skew between clock signals, such that an interval between timings provided by the clock signals becomes wider.

Similar to FIG. 9, with regard to the example of FIG. 12, the signal level of the data vDAT may change from a level lower than the reference level RV1 to a level higher than the reference level RV1. In some cases, the signal rSG2 may be sampled at timings having an interval wider than an interval between intended timings. Referring to sampling points W2 of FIG. 12, the signal rSG2 may be sampled at time t27 and time t37 which follows time t27. For example, the timing of time t27 may be provided by the clock signal vCLK2, and the timing of time t37 may be provided by the clock signal vCLK3.

For example, the signal level of the data vDAT at time t27 may be lower than the reference level RV3, and the signal level of the data vDAT at time t37 may be higher than the reference level RV2. Accordingly, an error of the signal level of the data vDAT with respect to the reference level RV3 at time t27 may be negative, and an error of the signal level of the data vDAT with respect to the reference level RV2 at time t37 may be positive.

Meanwhile, in some cases, the signal rSG2 may be sampled at timings having an interval narrower than an interval between intended timings. Referring to sampling points N2 of FIG. 12, the signal rSG2 may be sampled at time t28 and time t38 which follows time t28. For example, the timing of time t28 may be provided by the clock signal vCLK2, and the timing of time t38 may be provided by the clock signal vCLK3. For example, the signal level of the data vDAT at time t28 may be higher than the reference level RV3, and the signal level of the data vDAT at time t38 may be lower than the reference level RV2. Accordingly, an error of the signal level of the data vDAT with respect to the reference level RV3 at time t28 may be positive, and an error of the signal level of the data vDAT with respect to the reference level RV2 at time t38 may be negative.

Referring to FIG. 13, observed values associated with the sampling points W2 and N2 are illustrated. The sampling points W2 and N2 may be associated with a case where the signal rSG2 transitions from the second data value (e.g., logic 0) to the first data value (e.g., logic 1) between a preceding timing and a following timing which succeeds the preceding timing.

In this case, a negative error at the preceding timing and a positive error at the following timing may mean that an interval between actual timings is wider than an interval between intended timings (e.g., refer to the sampling points W2 of FIG. 12). Accordingly, the CDR circuit 200a of FIG. 2 or the CDR circuit 200b of FIG. 3 may decrease skew between clock signals, such that an interval between timings provided by the clock signals becomes narrower.

A positive error at the preceding timing and a negative error at the following timing may mean that an interval between actual timings is narrower than an interval between intended timings (e.g., refer to the sampling points N2 of FIG. 12). Accordingly, the CDR circuit 200a of FIG. 2 or the CDR circuit 200b of FIG. 3 may increase skew between clock signals, such that an interval between timings provided by the clock signals becomes wider.

The CDR circuit 200a of FIG. 2 or the CDR circuit 200b of FIG. 3 may detect the skew mismatch based on a result of comparing the reference levels RV2 and RV3, which are different from the reference level RV1, with signal levels of the data vDAT at successive timings of the clock signals vCLK1, vCLK2, vCLK3, and vCLK4. According to the examples described with reference to FIGS. 11 to 13, the skew mismatch of the clock signals vCLK1, vCLK2, vCLK3, and vCLK4 may be detected based on delay hold conditions illustrated in FIG. 10. In addition, the CDR circuit 200a of FIG. 2 or the CDR circuit 200b of FIG. 3 may adjust or calibrate (e.g., increase or decrease) the skew between the clock signals vCLK1, vCLK2, vCLK3, and vCLK4 to resolve the detected skew mismatch.

In the examples of FIGS. 11 to 13, adjusting the skew between the clock signals vCLK1, vCLK2, vCLK3, and vCLK4 may be based on a sign of an error at a preceding timing being different from (e.g., opposite to) a sign of an error at a following timing. To adjust skew between at least two clock signals which provide unintended timings among the clock signals vCLK1, vCLK2, vCLK3, and vCLK4, delays of the at least two clock signals may be adjusted in different directions.

For example, referring to FIG. 6, an interval td1 between timings provided by the clock signals vCLK2 and vCLK3 may be narrower than an intended interval td. To increase skew between the clock signals vCLK2 and vCLK3, the CDR circuit 200a of FIG. 2 or the CDR circuit 200b of FIG. 3 may decrease a delay of the clock signal vCLK2 and may increase a delay of the clock signal vCLK3. On the other hand, an interval td2 between timings provided by the clock signals vCLK3 and vCLK4 may be wider than the intended interval td. To decrease skew between the clock signals vCLK3 and vCLK4, the CDR circuit 200a of FIG. 2 or the CDR circuit 200b of FIG. 3 may increase a delay of the clock signal vCLK3 and may decrease a delay of the clock signal vCLK4.

Referring to FIG. 6, the quantities of delays to be increased/decreased to adjust skew may be different from each other. For example, as time SK2 is different from time SK3, the quantity by which a delay of the clock signal vCLK3 increases may be different from the quantity by which a delay of the clock signal vCLK4 decreases. For example, directions and quantities of delays may be adjusted independently of each other.

According to the examples described with reference to FIGS. 8 to 13, the CDR circuit 200a of FIG. 2 or the CDR circuit 200b of FIG. 3 may detect the timing error and the skew mismatch of the clock signals vCLK1, vCLK2, vCLK3, and vCLK4. In addition, the CDR circuit 200a of FIG. 2 or the CDR circuit 200b of FIG. 3 may adjust delays of the clock signals vCLK1, vCLK2, vCLK3, and vCLK4 and skew between the clock signals vCLK1, vCLK2, vCLK3, and vCLK4. Accordingly, the timing error of the clock signals vCLK1, vCLK2, vCLK3, and vCLK4 may be resolved, and the skew between the clock signals vCLK1, vCLK2, vCLK3, and vCLK4 may be adjusted uniformly.

According to the examples described with reference to FIGS. 8 to 13, in a circuit design which employs a plurality of clock paths, the clock signals vCLK1, vCLK2, vCLK3, and vCLK4 may be recovered exactly. Accordingly, stability and reliability of operations of electronic circuits using the clock signals vCLK1, vCLK2, vCLK3, and vCLK4 may be improved.

The delay and skew adjustment described with reference to FIGS. 8 to 13 may be performed together with recovering the data vDAT and the clock signals vCLK1, vCLK2, vCLK3, and vCLK4. For example, the delay and skew adjustment according to the example embodiments may be provided in background in real time during an operation of the CDR circuit 200a of FIG. 2 or the CDR circuit 200b of FIG. 3. Accordingly, while the CDR circuit 200a of FIG. 2 or the CDR circuit 200b of FIG. 3 operates, timing and skew for the clock signals vCLK1, vCLK2, vCLK3, and vCLK4 may be controlled.

The examples described with reference to FIGS. 8 to 13 may be associated with the signal rSG2 of a non-return-to-zero (NRZ) type which is capable of expressing two data values (e.g., logic 1 and logic 0). In one embodiment, a plurality of reference levels may be applied to a signal of a pulse amplitude modulation (PAM) type such as PAM-4 or PAM-8 or a signal of any other type. In these cases, the plurality of reference levels may be respectively compared with a plurality of signal levels of data at a plurality of successive timings of a plurality of clock signals, and delays and skew of the plurality of clock signals may be adjusted based on the comparison result.

Figure 14:
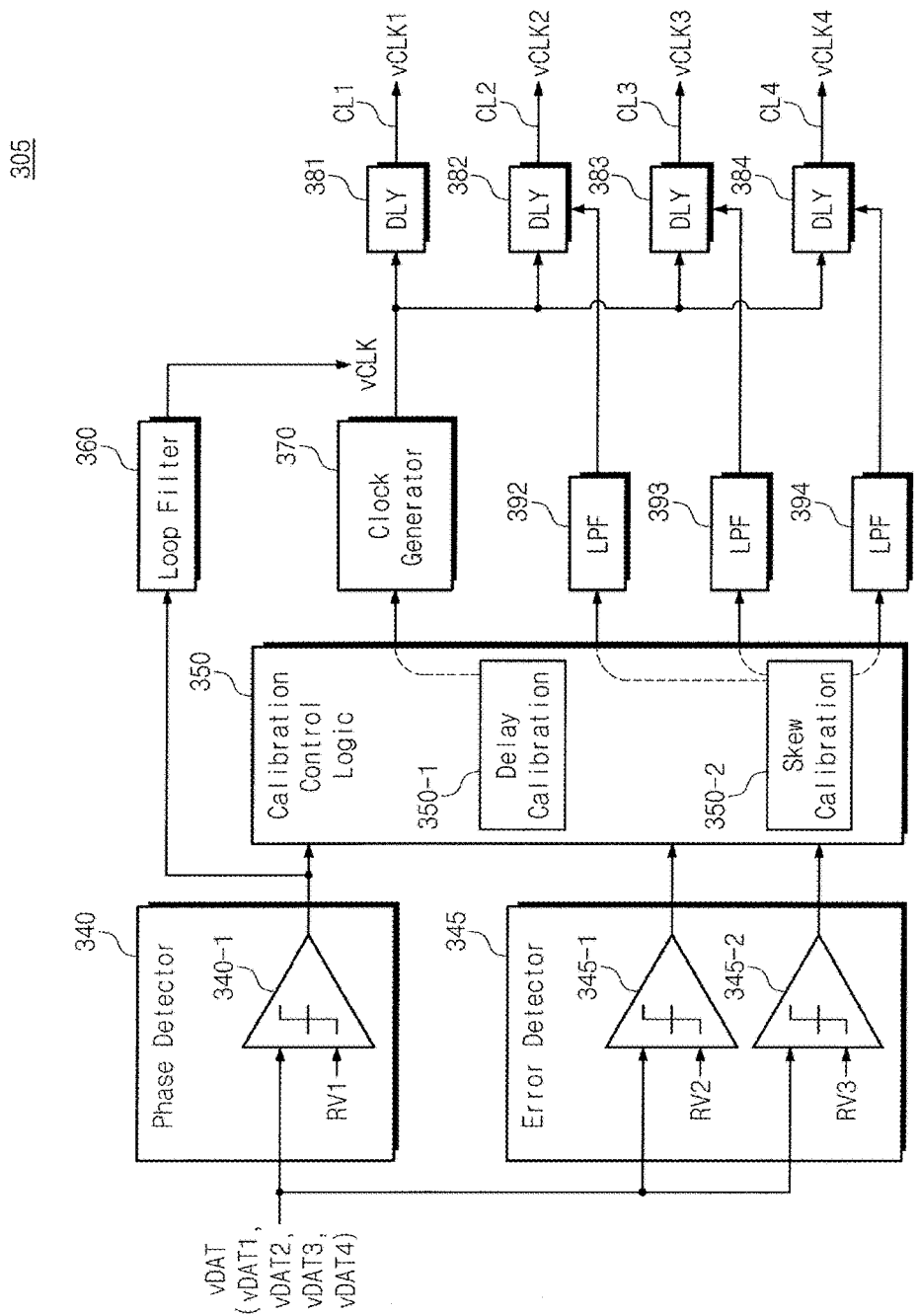
FIG. 14 illustrates another embodiment of a clock recovery circuit.

FIG. 14 illustrates an embodiment of the clock recovery circuit 205a or 205b in the CDR circuit 200a of FIG. 2 or the CDR circuit 200b of FIG. 3. In some example embodiments, the clock recovery circuit 205a or 205b may include a clock recovery circuit 305 of FIG. 14.

The clock recovery circuit 305 may include a phase detector 340, an error detector 345, a calibration control logic circuit 350, a loop filter 360, a clock generator 370, and filters 392, 393, and 394. In some example embodiments, the clock recovery circuit 305 may include some or all of delay circuits 381, 382, 383, and 384.

The phase detector 340, the loop filter 360, the clock generator 370, and the delay circuits 381, 382, 383, and 384 may correspond to the phase detector 240a or 240b, the loop filter 260a or 260b, the clock generator 270a or 270b, and the delay circuits 281a, 282a, 283a, and 284a or 281b, 282b, 283b, and 284b of FIG. 2 or 3.

The phase detector 340 may include, for example, a comparator 340-1 that compares a signal level of the data vDAT (or some or all of the data vDAT1, vDAT2, vDAT3, and vDAT4) with the reference level RV1. The comparator 340-1 may output a comparison result indicating a transition of a data value of the data vDAT. Accordingly, the phase detector 340 may detect the transition of the data vDAT based on the reference level RV1.

For example, the error detector 345 may include comparators 345-1 and 345-2. The comparator 345-1 may compare a signal level of the data vDAT (or some or all of the data vDAT1, vDAT2, vDAT3, and vDAT4) with the reference level RV2. The comparator 345-2 may compare the signal level of the data vDAT (or some or all of the data vDAT1, vDAT2, vDAT3, and vDAT4) with the reference level RV3.

Accordingly, the comparators 345-1 and 345-2 may output comparison results. The comparison result of the comparator 345-1 may indicate a sign of an error of the signal level of the data vDAT with respect to the reference level RV2. The comparison result of the comparator 345-2 may indicate a sign of an error of the signal level of the data vDAT with respect to the reference level RV3. The comparison results of the comparators 340-1, 345-1, and 345-2 may be provided to the calibration control logic circuit 350.

The calibration control logic circuit 350 may include a delay calibration circuit 350-1 and a skew calibration circuit 350-2. The delay calibration circuit 350-1 and the skew calibration circuit 350-2 may detect the timing error and the skew mismatch and may adjust delays and skew of the clock signals vCLK1, vCLK2, vCLK3, and vCLK4, according to the methods of, for example, FIGS. 8 to 13. The delay calibration circuit 350-1 and the skew calibration circuit 350-2 may use the comparison results of the comparators 340-1, 345-1, and 345-2.

For example, the delay calibration circuit 350-1 may include a logic circuit which combines the observed values described with reference to FIGS. 8 to 10 and outputs a control value associated with delay calibration. The delay calibration circuit 350-1 may output the control value based on signs of errors of signal levels of the data vDAT with respect to the reference levels RV2 and RV3 being the same. The control value output from the delay calibration circuit 350-1 may be referenced to detect and resolve the timing error.

The skew calibration circuit 350-2 may include, for example, a logic circuit which combines the observed values described with reference to FIGS. 11 to 13 to output control values associated with skew calibration. The skew calibration circuit 350-2 may output the control values based on signs of errors of signal levels of the data vDAT with respect to the reference levels RV2 and RV3 being different from each other. The control values output from the skew calibration circuit 350-2 may be referenced to detect and resolve the skew mismatch.

The control values output from the delay calibration circuit 350-1 and the skew calibration circuit 350-2 may indicate whether a delay and skew are to be increased or decreased. The calibration control logic circuit 350 may output a control value based on an output of the error detector 345, in response to a transition detected by the phase detector 340.

The clock generator 370 may output the clock signal vCLK, which may include edges corresponding to transitions of the data vDAT or some or all of the data vDAT1, vDAT2, vDAT3, and vDAT4, based on the transitions detected by the phase detector 340 and an output filtered by the loop filter 360.

The clock generator 370 may output the clock signal vCLK based on the control value provided from the delay calibration circuit 350-1. For example, a delay of the clock signal vCLK may increase or decrease based on the control value provided from the delay calibration circuit 350-1. Accordingly, timings provided by the clock signal vCLK may become later or earlier.

The delay circuits 381, 382, 383, and 384 may delay the clock signal vCLK to output the clock signals vCLK1, vCLK2, vCLK3, and vCLK4 through the clock lines CL1, CL2, CL3, and CL4, respectively. Delays provided by the delay circuits 381, 382, 383, and 384 may be different from each other. Accordingly, the clock signals vCLK1, vCLK2, vCLK3, and vCLK4 may provide different timings.

The filters 392, 393, and 394 may output final control values based on the control values output from the calibration control logic circuit 350. For example, the filters 392, 393, and 394 may filter the control values provided from the skew calibration circuit 350-2 to output the final control values. The final control values may be provided to the delay circuits 382, 383, and 384. The delay circuits 382, 383, and 384 may adjust delays of the clock signals vCLK2, vCLK3, and vCLK4 based on the final control values, and thus skew between the clock signals vCLK1, vCLK2, vCLK3, and vCLK4 may be adjusted.

In some example embodiments, the filters 392, 393, and 394 may separately output the final control values for the delay circuits 382, 383, and 384. For the respective clock lines CL2, CL3, and CL4, the delay circuits 382, 383, and 384 may adjust delays separately and independently based on the separate final control values. Accordingly, quantities and directions of delays provided by the delay circuits 382, 383, and 384 may be calibrated separately and independently. An example has been described with reference to FIGS. 6 and 11 to 13.

In some example embodiments, each of the filters 392, 393, and 394 may accumulate the control values output from the skew calibration circuit 350-2 to generate a final control value. To this end, each of the filters 392, 393, and 394 may include a circuit such as an accumulator.

Each of the filters 392, 393, and 394 may, for example, accumulate control values during a reference time or may accumulate control values until control values are accumulated as many as a reference count. In one embodiment, each of the filters 392, 393, and 394 may accumulate control values until the quantity of a delay increase or the quantity of a delay decrease indicated by the accumulated control values reaches a reference quantity. The reference count or quantity for accumulating control values may be different in other embodiments.

In some cases, it may be inefficient or ineffective to adjust skew for each and every timing of the clock signals vCLK1, vCLK2, vCLK3, and vCLK4. Accordingly, depending on an intended reference, each of the filters 392, 393, and 394 may accumulate control values and output a final control value. The final control value may be referenced to suitably adjust delays of the clock signals vCLK2, vCLK3, and vCLK4 based on sufficiently collected control values. Each of the filters 392, 393, and 394 may be, for example, a low-pass filter (LPF).

In some example embodiments, a CDR circuit including the clock recovery circuit 305 may further include a register. The register may store various setting values. For example, the setting values may be associated with one or more attributes (e.g., operation and performance) of each of the filters 392, 393, and 394. For example, the setting value may indicate whether an operation of each of the filters 392, 393, and 394 is to be activated or may indicate a condition of a reference for accumulating control values.

Figure 15:
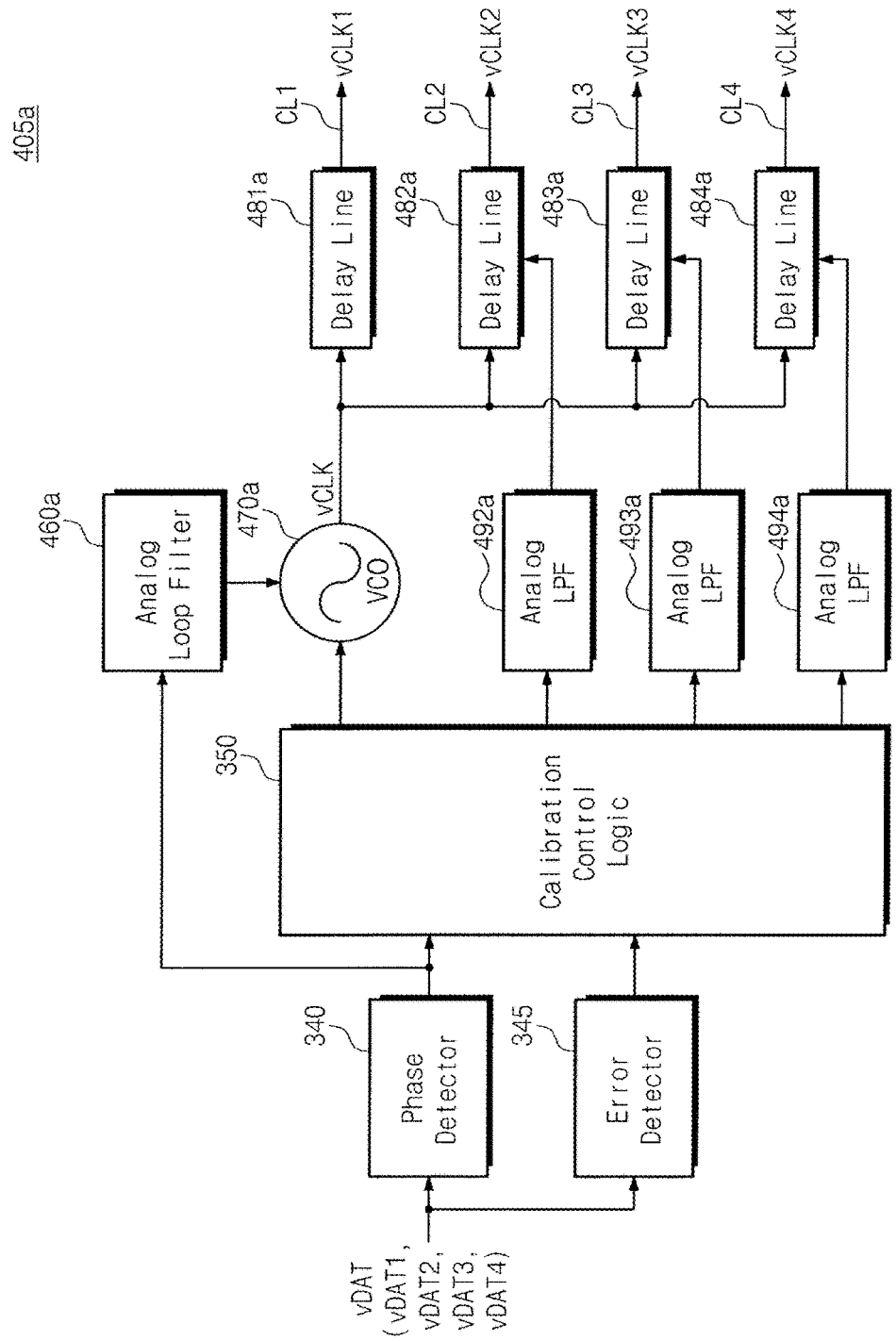
FIG. 15 illustrates an example implementation of the clock recovery circuit of FIG. 14.

FIG. 15 illustrates an example implementation associated with the clock recovery circuit 305 of FIG. 14. In some example embodiments, the clock recovery circuit 305 may include a clock recovery circuit 405a of FIG. 15.

The clock recovery circuit 405a may include the phase detector 340, the error detector 345, the calibration control logic circuit 350, an analog loop filter 460a, a voltage controlled oscillator 470a, some or all of delay lines 481a, 482a, 483a, and 484a, and analog LPFs 492a, 493a, and 494a.

The phase detector 340, the error detector 345, and the calibration control logic circuit 350 have been described with reference to FIG. 14. The analog loop filter 460a, the voltage controlled oscillator 470a, the delay lines 481a, 482a, 483a, and 484a, and the analog LPFs 492a, 493a, and 494a may correspond to the analog loop filter 360, the clock generator 370, the delay circuits 381, 382, 383, and 384, and the filters 392, 393, and 394 of FIG. 14.

In some example embodiments, the clock recovery circuit 405a may be configured based on an analog scheme. In the analog scheme, the voltage controlled oscillator 470a may output the clock signal vCLK based on a control voltage from the analog loop filter 460a. In addition, the analog LPFs 492a, 493a, and 494a may be employed. Final control values output from the analog LPFs 492a, 493a, and 494a may be used to control delays provided by the delay lines 482a, 483a, and 484a.

Figure 16:
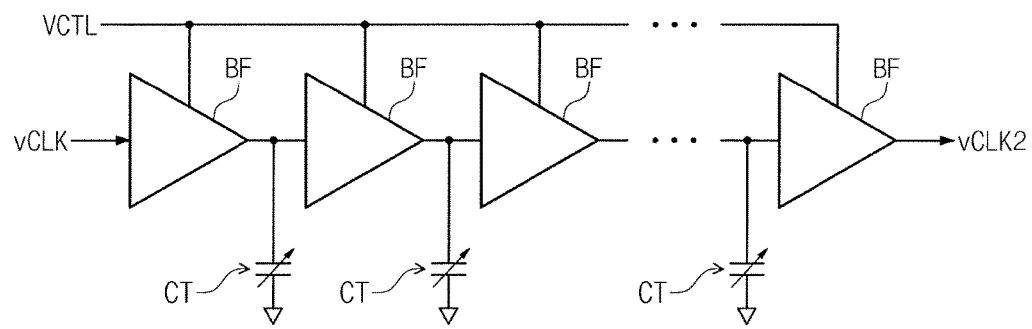
FIG. 16 illustrates an embodiment of a method for adjusting delay of a clock line.

FIG. 16 illustrates an embodiment of a method for adjusting a delay of the clock line CL2 in the clock recovery circuit 405a of FIG. 15. A delay for the clock line CL2 may be provided by the delay line 482a. For example, the delay line 482a may delay the clock signal vCLK to output the clock signal vCLK2. The delay line 482a may include one or more delay buffers BFs. Each of the delay buffers BFs may delay the clock signal vCLK.

A delay of each delay buffer BF may be adjusted, for example, based on a voltage value of a control voltage VCTL and/or capacitance values of variable capacitors CTs. Accordingly, for example, a final control value from the analog LPF 492a of FIG. 15 may be referenced to adjust the voltage value of the control voltage VCTL and/or the capacitance values of the variable capacitors CTs. When the voltage value of the control voltage VCTL and/or the capacitance values of the variable capacitors CTs are adjusted, the delay of each delay buffer BF may be adjusted and, thus, the delay of the delay line 482a may be adjusted. Other delay lines 483a and 484a of FIG. 15 may be the same as or similar to the delay line 482a.

Figure 17:
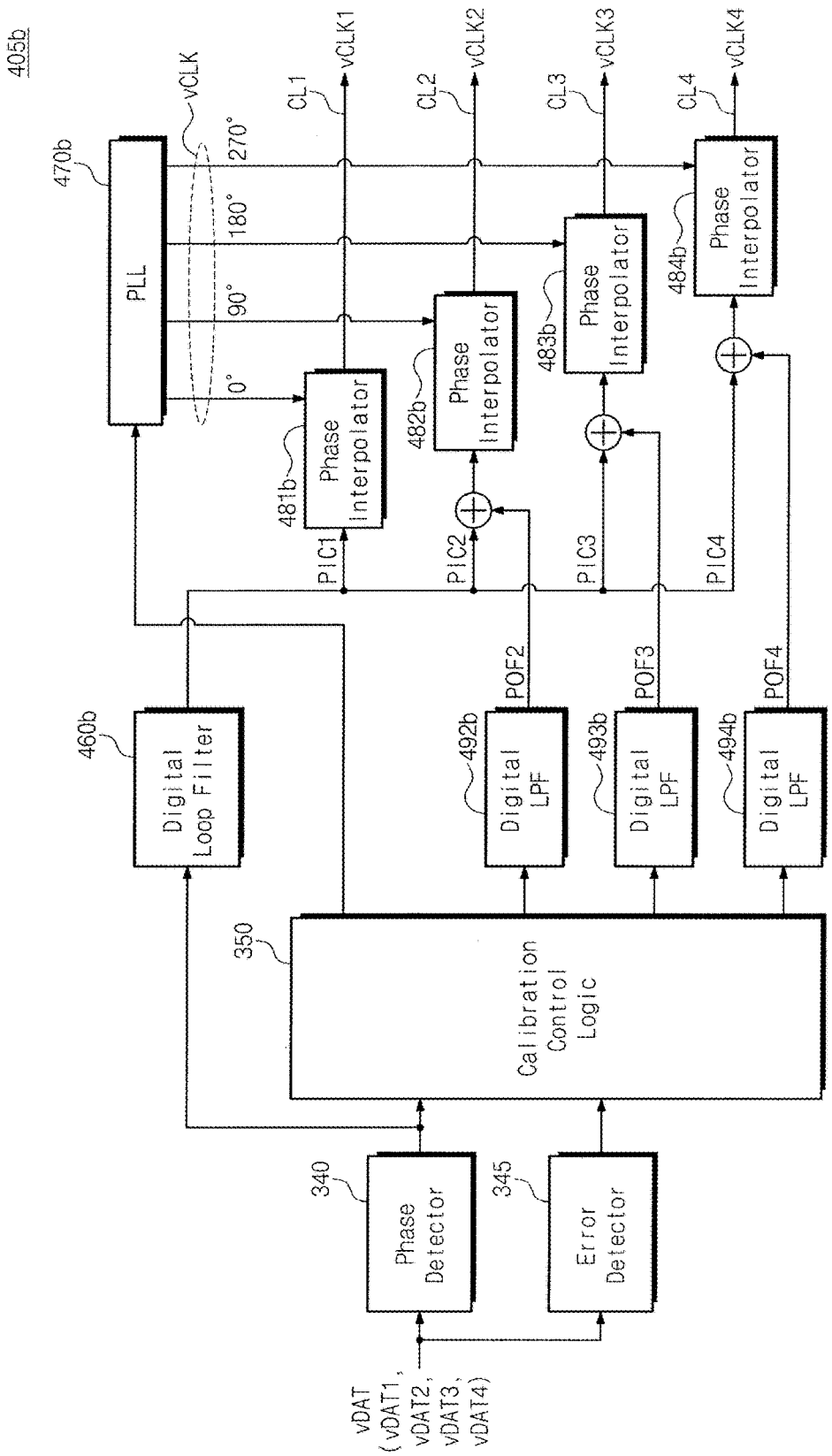
FIG. 17 illustrates another example implementation of the clock recovery circuit of FIG. 14.

FIG. 17 illustrates an example implementation associated with the clock recovery circuit 305 of FIG. 14. In some example embodiments, the clock recovery circuit 305 may include a clock recovery circuit 405b of FIG. 17.

The clock recovery circuit 405b may include the phase detector 340, the error detector 345, the calibration control logic circuit 350, a digital loop filter 460b, a phase locked loop (PLL) 470b, some or all of phase interpolators 481b, 482b, 483b, and 484b, and digital LPFs 492b, 493b, and 494b.

The phase detector 340, the error detector 345, and the calibration control logic circuit 350 have been described with reference to FIG. 14. The digital loop filter 460b, the PLL 470b, the phase interpolators 481b, 482b, 483b, and 484b, and the digital LPFs 492b, 493b, and 494b may correspond to the loop filter 360, the clock generator 370, the delay circuits 381, 382, 383, and 384, and the filters 392, 393, and 394 of FIG. 14.

In some example embodiments, the clock recovery circuit 405b may be configured based on a digital scheme. In the digital scheme, for example, the PLL 470b may output the clock signal vCLK having phases which correspond to 0°, 90°, 180°, and 270° to the phase interpolators 481b, 482b, 483b, and 484b, respectively.

The phase interpolators 481b, 482b, 483b, and 484b may adjust the corresponding phases of the clock signal vCLK based on respective phase interpolation codes PIC1, PIC2, PIC3, and PIC4 from the digital loop filter 460b. Accordingly, the phases of the clock signals vCLK1, vCLK2, vCLK3, and vCLK4 may be adjusted to correspond to 0°, 90°, 180°, and 270°, respectively.

In addition, the digital LPFs 492b, 493b, and 494b may be employed. The digital LPFs 492b, 493b, and 494b may respectively output phase offset codes POF2, POF3, and POF4 as final control values. The phase offset codes POF2, POF3, and POF4 may be respectively added to the phase interpolation codes PIC2, PIC3, and PIC4, and thus may be referenced to adjust the phases of the clock signals vCLK2, vCLK3, and vCLK4.

Figure 18:
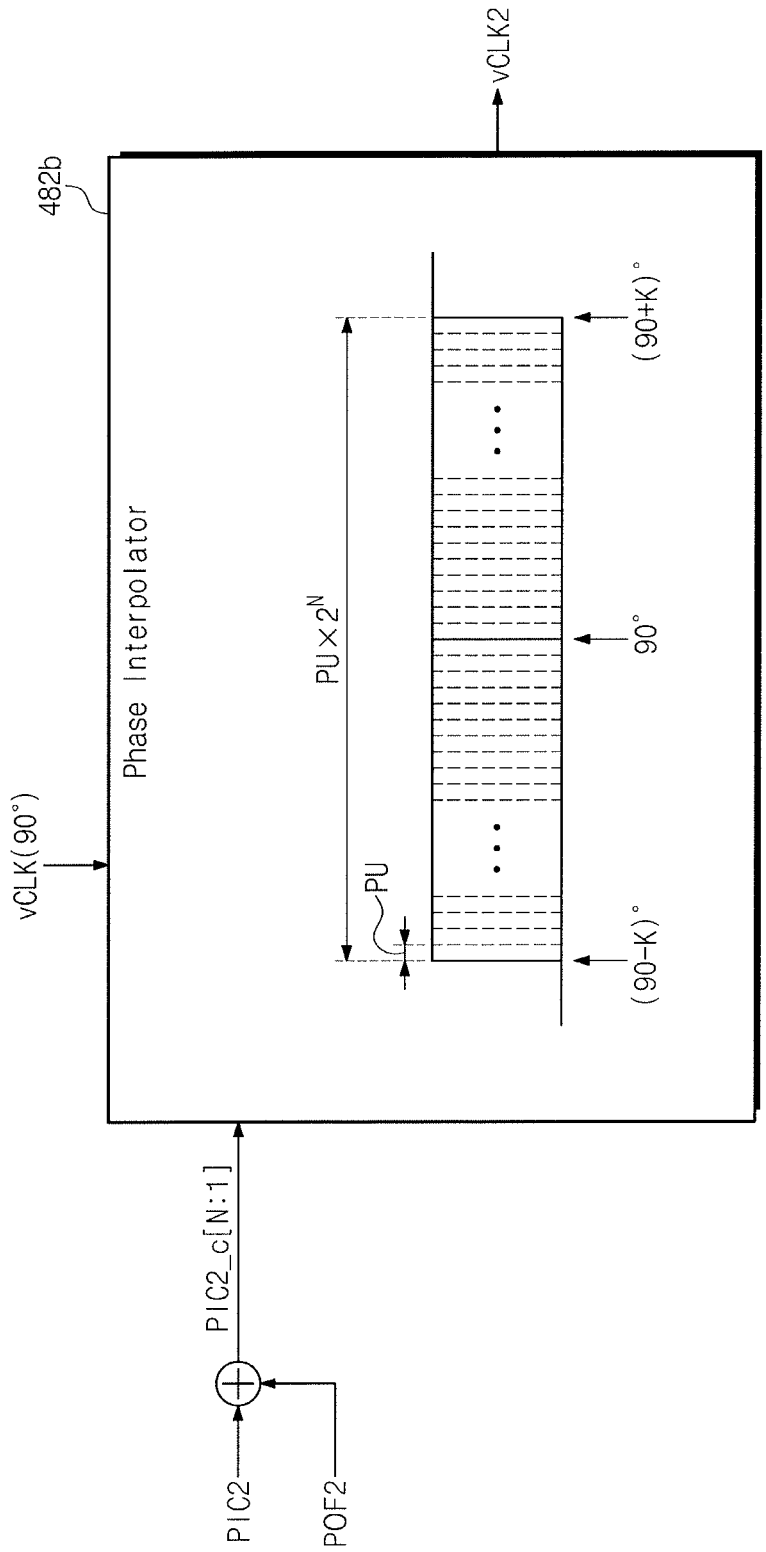
FIG. 18 illustrates another embodiment of a method for adjusting delay of a clock line.

FIG. 18 illustrates an embodiment of a method for adjusting the delay of the clock line CL2 in the clock recovery circuit 405b of FIG. 17. The delay for the clock line CL2 may be provided by the phase interpolator 482b. For example, the phase interpolator 482b may receive the clock signal vCLK having a phase which corresponds to 90°. In some cases, the phase of the clock signal vCLK may be out of 90° and a timing error may occur. The phase interpolator 482b may adjust a phase (e.g., delay) of the clock signal vCLK2 based on the phase interpolation code PIC2 to resolve the timing error.

The phase offset code POF2 may be referenced to resolve skew mismatch associated with the clock signal vCLK2. The phase offset code POF2 may be added to the phase interpolation code PIC2. Thus, the calibrated phase interpolation code PIC2_c[N:1] may be provided to the phase interpolator 482b. For example, the calibrated phase interpolation code PIC2_c[N:1] may be a code including binary values of N bits.

One bit of the calibrated phase interpolation code PIC2_c[N:1] may be referenced to adjust a phase of the clock signal vCLK as much as a unit phase PU. All bits of the calibrated phase interpolation code PIC2_c[N:1] may be referenced to adjust the phase of the clock signal vCLK as much as $2^N$ times the unit phase PU. Accordingly, the phase of the clock signal vCLK may be adjusted between (90−K°) and (90+K°) such that the phase of the clock signal vCLK2 becomes 90°. The other phase interpolators 483b and 484b of FIG. 17 may be configured to be the same as or similar to the phase interpolator 482b.

Figure 19:
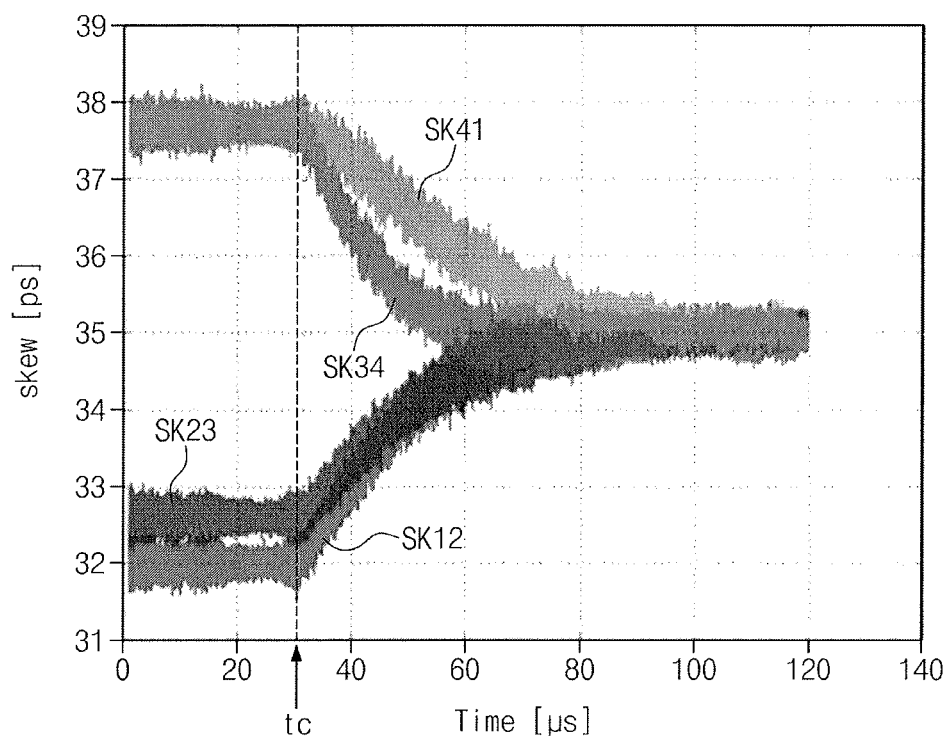
FIG. 19 illustrates a simulated embodiment for adjusting skew between clock signals.

FIG. 19 is a graph illustrating a result of example simulation in which skew between the clock signals vCLK1, vCLK2, vCLK3, and vCLK4 is adjusted according to some example embodiments. Skew SK12 may indicate skew between clock signals vCLK1 and vCLK2. Skew SK23 may indicate skew between clock signals vCLK2 and vCLK3. Skew SK34 may indicate skew between clock signals vCLK3 and vCLK4. Skew SK41 may indicate skew between clock signals vCLK4 and vCLK1.

Each skew SK12, SK23, SK34, and SK41 may be intended to become 35 ps, for example. Skew mismatch may occur due to various causes, and each skew SK12, SK23, SK34, and SK41 may different in another embodiment. e.g., may vary between 32 ps and 38 ps.

To resolve the skew mismatch, skew adjustment may be provided from time tc according to some example embodiments. As a result, each skew SK12, SK23, SK34, and SK41 may converge to 35 ps. It may be understood that the skew SK12, SK23, SK34, and SK41 becomes almost uniform after 80 its elapses.

Figure 20:
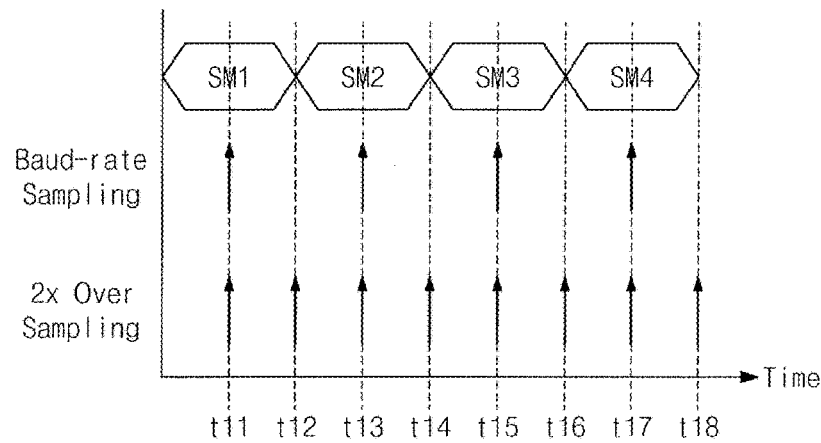
FIG. 20 illustrates an embodiment of sampling schemes.

FIG. 20 illustrates a timing diagram for describing example sampling schemes in accordance with one or more embodiments. The above descriptions may be associated with the example case of a Baud-rate clock signal which provides timings (e.g., time t11, t13, t15, and t17) for sampling the center of each of the symbols SM1, SM2, SM3, and SM4. The example embodiments may be changed or modified to employ a clock signal for oversampling. For example, a clock signal for 2× oversampling may provide timings of time t11 to t18. Timings of time t11, t13, t15, and t17 among the provided timings may be used to implement some example embodiments. For example, signal levels at time t11, t13, t15, and t17 may be referenced to detect and resolve a timing error and skew mismatch of clock signals.

Figure 21:
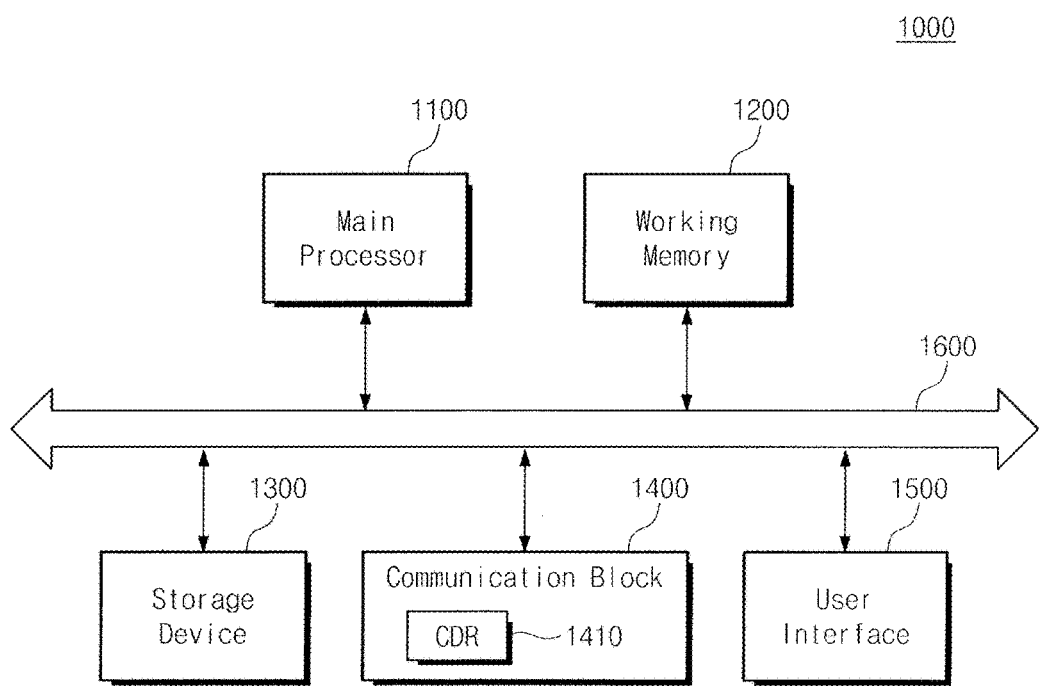
FIG. 21 illustrates an embodiment of an electronic system.

FIG. 21 illustrates an embodiment of an electronic system 1000 which employs a CDR circuit 1410. The electronic system 1000 may include a main processor 1100, a working memory 1200, a storage device 1300, a communication block 1400, a user interface 1500, and a bus 1600. The electronic system 1000 may be a desktop computer, a laptop computer, a tablet computer, a smart phone, a wearable device, an electric vehicle, a workstation, or another electronic device. The electronic system 1000 may be an electronic device used by an end-user or may be a component of a large-scale system such as a server system or a data center.

The main processor 1100 may control overall operations of the electronic system 1000. The main processor 1100 may process various kinds of arithmetic operations and/or logical operations and, for example, may be implemented with a general-purpose processor, a special-purpose processor, or an application processor.

The working memory 1200 may store data used for an operation of the electronic system 1000. For example, the working memory 1200 may temporarily store data processed or to be processed by the main processor 1100. For example, the working memory 1200 may include a volatile memory, such as a dynamic random access memory (DRAM), a synchronous DRAM (SDRAM), and/or the like, and/or a nonvolatile memory, such as a phase-change RAM (PRAM), a magneto-resistive RAM (MRAM), a resistive RAM (ReRAM), a ferro-electric RAM (FRAM), and/or the like.

A memory device of the storage device 1300 may store data regardless of power being supplied. For example, the storage device 1300 may include a nonvolatile memory device such as a flash memory, a PRAM, an MRAM, a ReRAM, an FRAM, and/or the like. For example, the storage device 1300 may include a storage medium such as a hard disk drive (HDD), a solid state drive (SSD), a card storage, an embedded storage, and/or the like.

The communication block 1400 may communicate with an external device/system of the electronic system 1000. The communication block 1400 may be a component for providing a communication service such as a modulator/demodulator (MODEM) chip or device, a network card, a communication switch, a hub, a router, and/or the like. For example, the communication block 1400 may support at least one of various wireless communication protocols such as LTE, WIMAX, GSM, CDMA, Bluetooth, near field communication (NFC), Wi-Fi, RFID, and/or another protocol, and/or at least one of various wired communication protocols such as TCP/IP, USB, Firewire, and/or another protocol.

The communication block 1400 may include various electronic circuits such as but not limited to a transmitter circuit, a receiver circuit, and the CDR circuit 1410, to provide communication services. The CDR circuit 1410 may adjust delays and skew of a plurality of clock signals according to the example embodiments. Accordingly, a timing error of sampling timings of the plurality of clock signals may be resolved, and skew between the plurality of clock signals may be adjusted uniformly. The CDR circuit 1410 may exactly recover the plurality of clock signals.

The user interface 1500 may arbitrate communication between a user and the electronic system 1000. For example, the user interface 1500 may include input interfaces such as a keyboard, a mouse, a keypad, a button, a touch panel, a touch screen, a touch pad, a touch ball, a camera, a microphone, a gyroscope sensor, a vibration sensor, and/or the like. For example, the user interface 1500 may include output interfaces such as a liquid crystal display (LCD) device, a light emitting diode (LED) display device, an organic LED (OLED) display device, an active matrix OLED (AMOLED) display device, a speaker, a motor, and/or the like.

The bus 1600 may provide a communication path between components of the electronic system 1000. The components of the electronic system 1000 may exchange data with each other based on a bus format of the bus 1600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), universal flash storage (UFS), and/or the like.

The above descriptions have been provided to describe a CDR circuit employed for performing communications, but the embodiments described herein may be applied to other types of electronic circuits or for performing other types of operations or functions.

In accordance with one or more of the aforementioned embodiments, an error of a sampling timing of a clock signal may be resolved, and skew between the plurality of clock signals may be adjusted uniformly. Accordingly, in a circuit design employing a plurality of clock paths, a CDR circuit may exactly recover the plurality of clocks signals. As a result, stability and reliability of an operation of an electronic circuit may be improved. In addition, some example embodiments may be provided in real time (e.g., in background) during an operation of the electronic circuit. Accordingly, sampling timings and skew for the plurality of clock signals may be controlled even while the electronic circuit operates.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An electronic circuit, comprising:
   a data recovery circuit to recover data from a received signal based on at least a first clock signal and a second clock signal which provide different timings; and
   a clock recovery circuit to adjust skew between the first clock signal and the second clock signal when a signal level of the recovered data is changed from a level lower than a first reference level to a level higher than the first reference level, or from the level higher than the first reference level to the level lower than the first reference level, at a time point between a first timing of the first clock signal and a second timing of the second clock signal following the first timing, wherein:
   the clock recovery circuit is to adjust the skew between the first clock signal and the second clock signal based on a result of a comparison between a first signal level of the recovered data at the first timing and at least one of a second reference level and a third reference level and a comparison between a second signal level of the recovered data at the second timing and at least one of the second reference level and the third reference level, the second reference level higher than the first reference level and the third reference level lower than the first reference level,
   the clock recovery circuit is to adjust the skew based on a first sign of an error of the first signal level with respect to one of the second and third reference levels, the first sign being opposite to a second sign of an error of the second signal level with respect to another one of the second and third reference levels.

2. The electronic circuit as claimed in claim 1, wherein the data recovery circuit is to sample the received signal at each of the different timings for data recovery.

3. The electronic circuit as claimed in claim 1, wherein the clock recovery circuit is to recover the first and second clock signals based on a transition of a data value of the recovered data.

4. The electronic circuit as claimed in claim 1, wherein the clock recovery circuit is to decrease the skew when:
   the first sign is positive,
   the second sign is negative, and
   the signal level of the recovered data is changed from the level higher than the first reference level to the level lower than the first reference level.

5. The electronic circuit as claimed in claim 1, wherein the clock recovery circuit is to increase the skew when:
   the first sign is negative,
   the second sign is positive, and
   the signal level of the recovered data is changed from the level higher than the first reference level to the level lower than the first reference level.

6. The electronic circuit as claimed in claim 1, wherein the clock recovery circuit is to decrease the skew when:
   the first sign is negative,
   the second sign is positive, and
   the signal level of the recovered data is changed from the level lower than the first reference level to the level higher than the first reference level.

7. The electronic circuit as claimed in claim 1, wherein the clock recovery circuit is to increase the skew when:
   the first sign is positive,
   the second sign is negative, and
   the signal level of the recovered data is changed from the level lower than the first reference level to the level higher than the first reference level.

8. The electronic circuit as claimed in claim 1, wherein:
a second delay of the second clock signal increases when a first delay of the first clock signal decreases to adjust the skew, and
the second delay decreases when the first delay increases to adjust the skew.

9. The electronic circuit as claimed in claim 1, wherein the clock recovery circuit is to adjust delays of the first and second clock signals in an identical direction, the delays to be adjusted in the identical direction when the first sign is identical to the second sign.

10. An electronic circuit, comprising:
a data recovery circuit to recover data from a received signal based on at least a first clock signal and a second clock signal which provide different timings; and
a clock recovery circuit to adjust skew between the first clock signal and the second clock signal when the recovered data transitions from a first data value at a first timing of the first clock signal to a second data value at a second timing of the second clock signal following the first timing, wherein:
the clock recovery circuit is to adjust the skew between the first clock signal and the second clock signal based on a result of a comparison of a second reference level higher than a first reference level and a third reference level lower than the first reference level with a first signal level associated with the first data value and a second signal level associated with the second data value, the first reference level corresponding to detection of a transition of the recovered data,
a second delay of the second clock signal is to increase when a first delay of the first clock signal decreases to adjust the skew, and
the second delay is to decrease when the first delay increases to adjust the skew.

11. The electronic circuit as claimed in claim 10, wherein the clock recovery circuit is to adjust the skew such that an interval between the first timing provided by the first clock signal and the second timing provided by the second clock signal becomes narrower or wider.

12. The electronic circuit as claimed in claim 10, wherein:
the clock recovery circuit is to decrease the skew to narrow an interval between a timing provided by the first clock signal and a timing provided by the second clock signal when one of the first and second signal levels is higher than the second reference level and another one of the first and second signal levels is lower than the third reference level.

13. The electronic circuit as claimed in claim 10, wherein:
the clock recovery circuit is to increase the skew to widen an interval between a timing provided by the first clock signal and a timing provided by the second clock signal when one of the first and second signal levels is lower than the second reference level and another one of the first and second signal levels is higher than the third reference level.

14. The electronic circuit as claimed in claim 10, wherein the clock recovery circuit includes:
a phase detector to detect the transition of the recovered data based on the first reference level;
an error detector to compare the first and second signal levels with the second and third reference levels to output a result of the comparison;
a control logic to output control values associated with the skew based on the output comparison result based on the detected transition; and
a filter to filter the control values output from the control logic to output final control values.

15. The electronic circuit as claimed in claim 14, wherein the control logic is to output the control values based on a first sign of an error of the first signal level with respect to one of the second and third reference levels, the first signal being opposite to a second sign of an error of the second signal level with respect to another one of the second and third reference levels.

16. The electronic circuit as claimed in claim 14, wherein the filter includes:
a first filter to output a first final control value; and
a second filter to output a second final control value,
wherein the first and second delays are to be independently adjusted based on the first and second final control values, respectively.

17. The electronic circuit as claimed in claim 14, wherein the filter is to accumulate the control values output from the control logic to generate the final control values.

18. The electronic circuit as claimed in claim 14, further comprising:
a register to store a setting value corresponding to operation and performance of the filter.

19. An electronic circuit, comprising:
a plurality of clock lines to transfer a plurality of clock signals based on different delays respectively; and
a clock recovery circuit to adjust skew between the plurality of clock signals based on a result of a comparison of a plurality of detection reference levels with a plurality of signal levels of data respectively, the plurality of detection reference levels being different from a transition reference level corresponding to detection of a transition of data, the plurality of signal levels of the data at a plurality of successive timings of the plurality of clock signals, wherein:
adjusting the skew is based on signs of errors of the plurality of signal levels with respect to the plurality of detection reference levels being different from each other, and
directions in which at least two of the different delays are adjusted to adjust the skew are different from each other.

20. The electronic circuit as claimed in claim 19, wherein the clock recovery circuit is to adjust quantities and directions of the different delays independently for the respective clock lines such that the skew is adjusted.

* * * * *